(12) United States Patent
Paulson

(10) Patent No.: US 10,730,790 B2
(45) Date of Patent: Aug. 4, 2020

(54) OPTICAL STRUCTURES AND ARTICLES WITH MULTILAYER STACKS HAVING HIGH HARDNESS AND METHODS FOR MAKING THE SAME

(71) Applicant: CORNING INCORPORATED, Corning, NY (US)

(72) Inventor: Charles Andrew Paulson, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 297 days.

(21) Appl. No.: 15/553,698

(22) PCT Filed: Feb. 25, 2016

(86) PCT No.: PCT/US2016/019448
§ 371 (c)(1),
(2) Date: Aug. 25, 2017

(87) PCT Pub. No.: WO2016/138195
PCT Pub. Date: Sep. 1, 2016

(65) Prior Publication Data
US 2018/0029929 A1 Feb. 1, 2018

Related U.S. Application Data

(60) Provisional application No. 62/272,335, filed on Dec. 29, 2015, provisional application No. 62/120,470, filed on Feb. 25, 2015.

(51) Int. Cl.
*B32B 15/04* (2006.01)
*B32B 17/06* (2006.01)
(Continued)

(52) U.S. Cl.
CPC ...... *C03C 17/3435* (2013.01); *C03C 17/3452* (2013.01); *G02B 1/14* (2015.01);
(Continued)

(58) Field of Classification Search
USPC .................. 428/688, 701, 702, 426
See application file for complete search history.

(56) References Cited

U.S. PATENT DOCUMENTS 8,088,502 B2  1/2012  Martin et al.
8,312,739 B2  11/2012  Lee et al.
(Continued)

FOREIGN PATENT DOCUMENTS

| | | |
|---|---|---|
| CN | 101618614 A | 1/2010 |
| JP | 2007248562 A1 | 9/2007 |
| WO | 03087429 A1 | 10/2003 |

OTHER PUBLICATIONS

Chinese Patent Application No. 201680023550.2; English Translation of the First Office Action dated Oct. 9, 2019; China Patent Office; 15 Pgs.
(Continued)

*Primary Examiner* — Lauren R Colgan

(57) ABSTRACT

Optically transparent articles and structures that include or are otherwise disposed on a substantially transparent substrate. These articles and structures also include a stack of N (N>2) bi-layers on the substrate, the stack having a thickness of at least 5 nm. Each bi-layer is defined by (a) a first layer; and (b) a second layer disposed on the first layer, the layers having at least one of different compositions and different microstructures. The stack has a stack refractive index between about 1.2 and about 2.2 or between about 100% and about 150% of a refractive index of the substrate, and a stack hardness of 15 GPa or greater when measured with a Berkovich Indenter Hardness Test along an indentation depth in the range from about 10% to about 50% of the
(Continued)

thickness of the stack disposed on a glass test substrate having a hardness between 6.5 and 8 GPa.

17 Claims, 6 Drawing Sheets

(51) Int. Cl.

| | | |
|---|---|---|
| *C03C 17/34* | (2006.01) | |
| *G02B 1/14* | (2015.01) | |
| *H05K 5/00* | (2006.01) | |
| *H05K 5/03* | (2006.01) | |

(52) U.S. Cl.
CPC ............. *H05K 5/0017* (2013.01); *H05K 5/03* (2013.01); *C03C 2217/281* (2013.01); *C03C 2217/78* (2013.01); *C03C 2218/155* (2013.01)

(56) References Cited

U.S. PATENT DOCUMENTS

| | | | |
|---|---|---|---|
| 8,561,429 B2 | 10/2013 | Allan et al. | |
| 8,747,998 B2* | 6/2014 | Chang | C23C 14/021 |
| | | | 428/336 |
| 10,416,352 B2* | 9/2019 | Hart | G02B 1/14 |
| 2002/0150745 A1 | 10/2002 | Martin et al. | |
| 2005/0095422 A1 | 5/2005 | Sager et al. | |
| 2013/0128342 A1* | 5/2013 | Mitarai | B32B 17/10036 |
| | | | 359/359 |
| 2013/0176615 A1* | 7/2013 | Uefuji | G02B 1/113 |
| | | | 359/359 |
| 2014/0233106 A1* | 8/2014 | Vergoehl | G02B 1/115 |
| | | | 359/601 |
| 2014/0334006 A1* | 11/2014 | Adib | G02B 1/105 |
| | | | 359/580 |
| 2014/0335332 A1* | 11/2014 | Bellman | G02B 1/105 |
| | | | 428/212 |
| 2014/0362444 A1* | 12/2014 | Paulson | G02B 1/115 |
| | | | 359/586 |
| 2014/0376094 A1* | 12/2014 | Bellman | G02B 1/113 |
| | | | 359/580 |
| 2015/0323705 A1* | 11/2015 | Hart | G02B 1/11 |
| | | | 359/580 |
| 2015/0355382 A1 | 12/2015 | Henn et al. | |
| 2018/0275318 A1* | 9/2018 | Amin | C03C 10/00 |
| 2018/0321425 A1* | 11/2018 | Hart | G02C 7/107 |
| 2019/0219739 A1* | 7/2019 | Gregorski | C03C 15/00 |

OTHER PUBLICATIONS

Dong et al; "Crystallization of AlON Layers and Its Effects on the Microstructure and Hardness of Reactively Synthesized ZrN/AlON Nanomultilayers"; J. Phys. D: Appl. Phys. 39, 2006, pp. 4838-4842.

Oliver et al; "An Improved Technique for Determining Hardness and Elastic Modulus Using Load and Displacement Sensing Indentation Experiments"; J. Mater. Res., vol. 7, No. 6, Jun. 1992; pp. 1564-1583.

Oliver et al; "Measurement of Hardness and Elastic Modulus by Instrumented Indentation: Advances in Understanding and Refinements to Methodology"; J. Mater. Res., vol. 19, No. 1; Jan. 2004; pp. 3-20.

International Search Report and Written Opinion of the International Searching Authority; PCT/US2016/019448; dated Jun. 27, 2016; 13 Pages; European Patent Office.

Japanese Patent Application No. 2017544913; Machine Translation of the Office Action dated Jan. 15, 2020; Japan Patent Office; 7 Pgs.

* cited by examiner

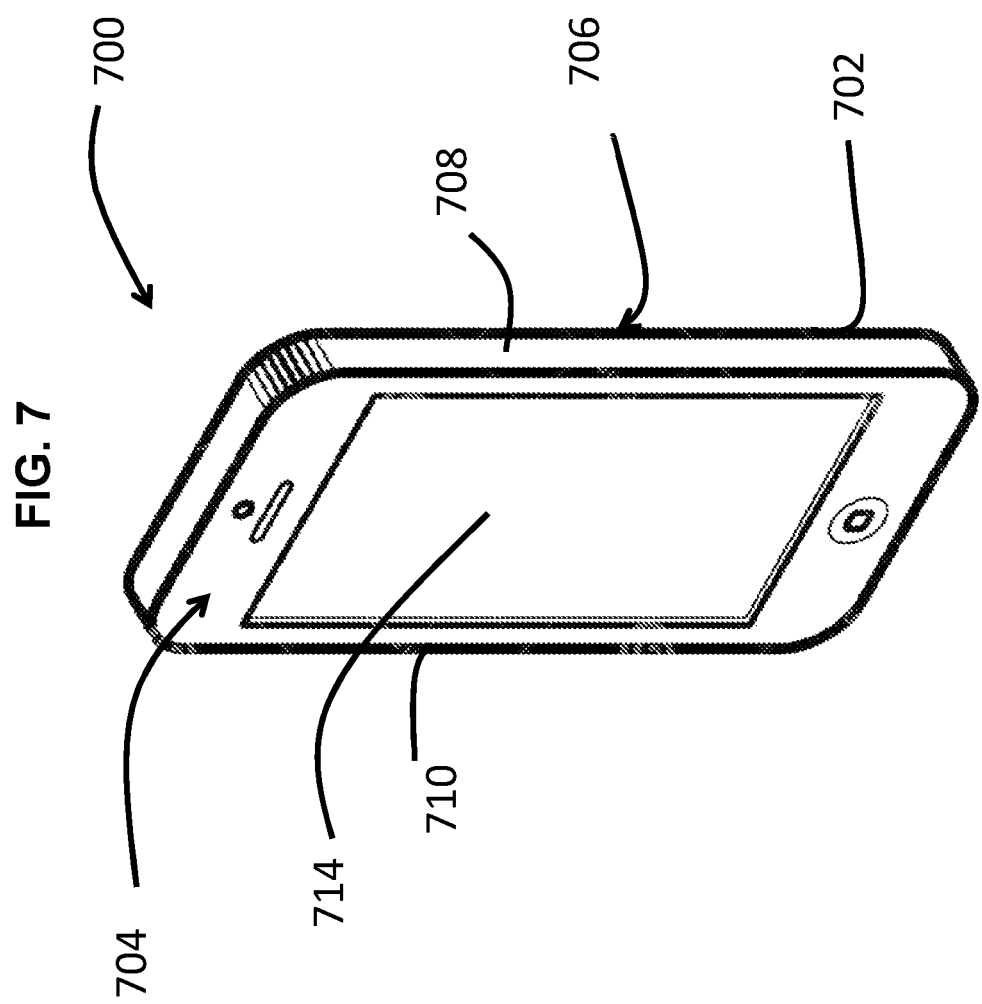

OPTICAL STRUCTURES AND ARTICLES WITH MULTILAYER STACKS HAVING HIGH HARDNESS AND METHODS FOR MAKING THE SAME

CROSS-REFERENCE TO RELATED APPLICATIONS

This application claims the benefit of priority under 35 U.S.C. § 371 of International Patent Application Serial No. PCT/US16/19448, filed on Feb. 25, 2016, which in turn, claims the benefit of priority under 35 U.S.C. § 119 of U.S. Provisional Application Ser. Nos. 62/272,335 and 62/120,470 filed on Dec. 29, 2015 and Feb. 25, 2015, respectively, the contents of each of which are relied upon and incorporated herein by reference in their entireties.

BACKGROUND

The disclosure relates to optically transparent articles and optical structures with high hardness and retained optical properties; and, more particularly, to such articles and structures with stacks having a number of bi-layers or multi-layers with such properties.

Cover and housing substrates are often used in consumer electronic products to protect critical devices within the product, to provide a user interface for input and/or display, and/or many other functions. Such consumer electronic products include mobile devices, such as smart phones, mp3 players and computer tablets. Cover and housing substrates may also be used in architectural articles, transportation-related articles, appliance articles, or any article that requires some transparency, scratch-resistance, abrasion resistance or a combination thereof. These applications and others also often demand a durable (e.g., scratch-resistant) cover and housing substrate, which also has strong optical performance characteristics. Often, the cover substrate includes glass for this purpose; however other substrate materials may be used.

Strong optical performance in terms of maximum light transmission and minimum reflectivity are required in cover substrate applications (and potentially in some housing substrate applications). Furthermore, cover substrate applications require that the color exhibited or perceived, in reflection and/or transmission, does not change appreciably as the viewing angle (or incident illumination angle) is changed. This is because, if the color, reflectivity or transmission changes with viewing angle to an appreciable degree, the user of the product incorporating the cover glass will perceive a change in the color or brightness of the display, which can diminish the perceived quality of the display. Of these changes, a change in color is often the most noticeable and objectionable to users.

Known cover substrates include glass and film combinations that can often exhibit a variety of different types of scratches after use in harsh operating conditions. In some instances, a significant portion of those scratches are microductile scratches, which typically include a single groove in a material having extended length and with depths in the range from about 100 nm to about 500 nm. Microductile scratches may be accompanied by other types of visible damage, such as sub-surface cracking, frictive cracking, chipping and/or wear. Evidence suggests that a majority of such scratches and other visible damage is caused by sharp contact that occurs in a single contact event. Once a significant scratch appears on the cover substrate, the appearance of the product is degraded since the scratch causes an increase in light scattering, which may cause significant reduction in brightness, clarity and contrast of images on the display. Significant scratches can also affect the accuracy and reliability of touch sensitive displays. A portion of such scratches and other visible damage as described above may also be caused by multiple contact events (including reciprocating abrasion or wear). These scratches, and even less significant scratches, are unsightly and can affect product performance.

Single event scratch damage can be contrasted with abrasion damage. Abrasion damage is typically caused by multiple contact events, such as reciprocating sliding contact from hard counter face objects (e.g., sand, gravel and sandpaper). Abrasion damage can generate heat, which can degrade chemical bonds in the film materials and cause flaking and other types of damage to the cover glass. In addition, since abrasion damage is often experienced over a longer term than the single events that cause scratches, the film material experiencing abrasion damage can also oxidize, which further degrades the durability of the film and thus the glass-film laminate. The single events that cause scratches generally do not involve the same conditions as the events that cause abrasion damage and therefore, the solutions often utilized to prevent abrasion damage may not also prevent scratches in cover substrates. Moreover, known scratch and abrasion damage solutions often compromise the optical properties.

Accordingly, there is a need for new articles, cover substrates and optical structures which are scratch resistant over a wide range of different types of scratches and/or abrasion resistant through high hardness properties, while demonstrating improved or retained optical performance.

SUMMARY

One aspect of the present disclosure pertains to an optical structure for a substrate including a stack of N bi-layers, N being set at a value of two or more and the stack having a thickness of at least 5 nm. Each bi-layer is defined by (a) a first layer; and (b) a second layer disposed on the first layer, the layers having at least one of different compositions and different microstructures. Further, the stack has a stack refractive index between about 1.2 and about 2.2 and a stack hardness of 15 GPa or greater when measured using a Berkovich Indenter Hardness Test along an indentation depth in the range from about 10% to about 50% of the thickness of the stack. In some embodiments, the stack may be disposed on a glass test substrate having a hardness between 6.5 and 8 GPa, when measuring the hardness using the Berkovich Indenter Hardness Test.

Another aspect of the present disclosure relates to an optical structure for a substrate including a stack of N bi-layers, N being set at a value of two or more and the stack having a thickness of at least 5 nm. Each bi-layer is defined by (a) a first layer; and (b) a second layer disposed on the first layer, the layers having either one or both a different composition from one another and a different microstructure from one another. Further, the stack has a stack refractive index between about 100% and about 150% of a refractive index of the substrate, and a stack hardness of 15 GPa or greater when measured using a Berkovich Indenter Hardness Test along an indentation depth in the range from about 10% to about 50% of the thickness of the stack, when the stack is disposed on a glass test substrate having a hardness between 6.5 and 8 GPa.

A further aspect of the present disclosure pertains to an optically transparent article including a substantially transparent substrate and a stack of N bi-layers disposed on the substrate forming an article surface, N being set at a value of two or more and the stack having a thickness of at least 5 nm. Each bi-layer is defined by (a) a first layer; and (b) a second layer disposed on the first layer, the layers having at least one of different compositions and different microstructures. The stack has a stack refractive index between about 100% and about 150% of a refractive index of the substrate. The article exhibits an article hardness of 15 GPa or greater, the article hardness measured with a Berkovich Indenter Hardness Test along an indentation depth in the range from about 10% to about 50% of the thickness of the stack. It should be understood that the article hardness is the measured hardness of the combination of the substrate and the stack of N bi-layers and the hardness is measured on the article surface. In some embodiments, the article hardness may be about 10 GPa or greater, 11 GPa or greater, 12 GPa or greater, 13 GPa or greater, 14 GPa or greater, 15 GPa or greater, 16 GPa or greater, 17 GPa or greater, 18 GPa or greater, 19 GPa or greater, 20 GPa or greater, 21 GPa or greater, 22 GPa or greater, 23 GPa or greater, 24 GPa or greater, 25 GPa or greater, 26 GPa or greater, or 27 GPa or greater.

Another aspect of the present disclosure relates to an optical structure including a stack of N multi-layers, N being set at a value from 2 to 2000 and the stack having a thickness of at least 5 nm. Each multi-layer includes: (a) a first layer; (b) a second layer disposed on the first layer; and (c) a third layer disposed on the second layer, the layers having either one or both a different composition from at least one other layer and a different microstructure from at least one other layer. In addition, the stack has a stack refractive index between about 1.2 and 2.2 and a stack hardness of 15 GPa or greater when measured with a Berkovich Indenter Hardness Test along an indentation depth in the range from about 10% to 50% of the thickness of the stack, when the stack is disposed on a glass test substrate having a hardness between 6.5 and 8 GPa. In some embodiments, the stack hardness may be about 10 GPa or greater, 11 GPa or greater, 12 GPa or greater, 13 GPa or greater, 14 GPa or greater, 15 GPa or greater, 16 GPa or greater, 17 GPa or greater, 18 GPa or greater, 19 GPa or greater, 20 GPa or greater, 21 GPa or greater, 22 GPa or greater, 23 GPa or greater, 24 GPa or greater, 25 GPa or greater, 26 GPa or greater, or 27 GPa or greater.

It should be understood that the measured stack hardness can be dependent upon the composition and material properties of the test substrate. Likewise, the measured article hardness can be dependent upon the composition and material properties of the substrate within the article. Accordingly, test substrates (and substrates) having a hardness substantially below 6.5 GPa or substantially above 8 GPa can influence the foregoing stack hardness (and article hardness) ranges. For example, a test substrate having a hardness of 1 GPa or 15 GPa could result in increased or decreased measured stack hardness values relative to those reported in the disclosure disposed on a test substrate having a hardness between about 6.5 and 8 GPa.

The stack hardness can be dependent upon the thickness of the stack according to certain aspects of the disclosure. Accordingly, the optically transparent article, the optical structures for a substrate and/or layer(s) in these articles and structures exhibit a maximum hardness at indentation depths greater than about 100 nm or greater than about 200 nm and thus exhibit sufficient hardness to provide scratch resistance that is not influenced by the substrate. In some embodiments, the optically transparent articles, the optical structures for a substrate and/or layer(s) in these articles and structures have a maximum hardness at such indentation depths and thus are resistant to specific scratches such as microductile scratches (which typically have depths of about 100 nm to about 500 nm or from about 200 nm to about 400 nm). For example, the surfaces of the optically transparent articles, optical structures or any one or more layers of these articles and structures may be resistant to microductile scratches because the article exhibits the hardness values recited herein along specific indentation depths, as measured by the Berkovich Indenter Hardness Test.

In certain embodiments, the substrate employed in the foregoing articles and structures may include an amorphous, a partially-crystalline, or a substantially crystalline substrate. The amorphous substrate can include a glass selected from the group consisting of soda lime glass, alkali aluminosilicate glass, alkali containing borosilicate glass and alkali aluminoborosilicate glass. The glass may be optionally chemically strengthened and/or may include a compressive stress (CS) layer with a surface CS of at least 250 MPa extending within the chemically strengthened glass from a surface of the chemically strengthened glass to a depth of layer (DOL). The DOL exhibited by such substrates may be at least about 10 μm.

According to some aspects of the disclosed articles and structures, the first layer can comprise a material selected may comprise a material selected from the group consisting of silicon aluminum oxynitride, silicon oxynitride, aluminum oxynitride, silicon nitride, aluminum nitride, silicon aluminum nitrides, boron nitride, tin oxide, zirconium oxide, titanium oxide, silicon oxide, calcium oxide, aluminum oxide, boron oxide, magnesium oxide, barium fluoride, and calcium fluoride.

According to further aspects of the disclosed articles and structures, stacks within these articles and structures can comprise bi-layers having the following first layer/second layer compositions: $TiN/SiO_2$, $TiN/Al_2O_3$, $ZrN/AlO_xN_y$, and $TiN/Si_3N_4$. Other combinations of first layer/second layer compositions for the stacks include: $MgO/AlO_xN_y$, $MgO/AlN$, $MgO/Si_uAl_vO_xN_y$, $ZrN/AlO_xN_y$, $ZrN/Si_uAl_vO_xN_y$, $BaF_2/Si_uAl_vO_xN_y$, $AlN/Al_vO_xN_y$, $AlN/Si_uAl_vO_xN_y$, $Si_xAl_yN_z/AlN$, $SiO_2/AlO_xN_y$, and $AlN/Al_2O_3$.

According to certain aspects of the disclosed optical articles and structures, the stacks employed in these articles and structures can exhibit a very low extinction coefficient, indicative of their optical clarity. In certain implementations, the stacks are characterized by an extinction coefficient, k, of zero, approximately zero or less than $10^{-3}$ at a wavelength of 400 nm.

The articles and structures described herein may include, or be employed within, articles with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. In one or more embodiments, the articles and structures described herein may form at least a portion of a cover substrate or housing of consumer electronic product such as mobile phones, computer tablets, computer notebooks, desk top computers, navigation systems, entertainment devices, and the like. Such products typically comprise: a housing having front, back, and side surfaces; electrical components that are at least partially inside the housing and including at least a controller, a memory, and a display at or adjacent to the front surface of the housing; and a cover substrate at or over the front surface of the housing such that it is over the display.

According to a further aspect, a method of making an optically transparent article is provided that includes a step of developing or forming a stack of N bi-layers on a substantially transparent substrate, N being set at a value of two or more and the stack having a thickness of at least 5 nm. The step of forming the stack of N bi-layers includes sub-steps of (a) depositing a first layer; and (b) depositing a second layer on the first layer. Further, the steps of depositing the first and second layers are repeated N times, and the first and second layers have at least one of different compositions and different microstructures. In addition, the stack has a stack refractive index between about 100% and about 150% of a refractive index of the substrate, and article has an article hardness of 15 GPa or greater, the article hardness measured on the stack with a Berkovich Indenter Hardness Test along an indentation depth in the range from about 10% to about 50% of the thickness of the stack.

Additional features and advantages will be set forth in the detailed description which follows. Additional features and advantages will be readily apparent to those skilled in the art from that description or recognized by practicing the embodiments described herein and in the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description, serve to explain principles and operation of the various embodiments.

BRIEF DESCRIPTION OF THE DRAWINGS

FIG. 7 is a consumer electronic product according to one or more embodiments.

DETAILED DESCRIPTION

Figure 1:
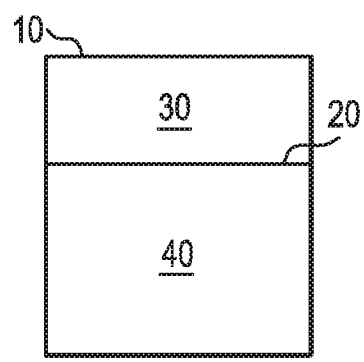
FIG. 1 is an illustration of a known substrate and a scratch-resistant material embodiment.

Reference will now be made in detail to various embodiment(s), examples of which are illustrated in the accompanying drawings. Whenever possible, the same reference numerals will be used throughout the drawings to refer to the same or like parts.

Known scratch-resistant materials, such as AlN, $Si_3N_4$, $AlO_xN_y$, and $SiO_xN_y$, have relatively high refractive indices, for example, in the range from about 1.7 to about 2.1.

Common substrates that include scratch-resistant materials are glass and plastic substrates. Glass and plastic materials typically have refractive indices in the range from about 1.45 to about 1.65. In certain instances, this difference in the refractive index of the scratch-resistant materials and the substrate can contribute to undesirable optical interference effects. These undesirable optical interference effects may be more pronounced where the scratch-resistant materials have a physical thickness in the range from about 0.05 to about 10 microns. Optical interference between reflected waves from the scratch-resistant material/air interface 10 (as shown in FIG. 1) and the scratch-resistant material/substrate interface 20 (as shown in FIG. 1) can lead to spectral reflectance oscillations that create apparent color in the scratch-resistant materials 30 (and/or the combination of the scratch-resistant materials 30 and substrate 40), particularly in reflection. The color shifts in reflection with viewing angle due to a shift in the spectral reflectance oscillations with incident illumination angle. The observed color and color shifts with incident illumination angle are often distracting or objectionable to device users, particularly under illumination with sharp spectral features such as fluorescent lighting and some LED lighting.

Figure 2:
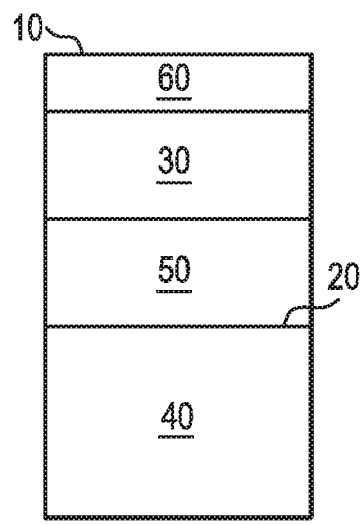
FIG. 2 is an illustration of a known article including a single layer interference layer.

Observed color and color shifts can be reduced by minimizing the reflectance at one or both interfaces 10, 20, thus reducing reflectance oscillations and reflected color shifts for the entire article. For scratch-resistant materials, the reduction in reflectance is often most feasible at the scratch-material/substrate interface 20, while simultaneously retaining the high durability or scratch resistance of the scratch-resistant materials/air interface 10. Various ways to reduce reflectance include the use of a single optical interference layer (e.g., single optical interference layer 50 as shown in FIG. 2) or a layer having a monotonic gradient in refractive index at the scratch-resistant material/substrate interface 20. Such options, however, often exhibit large oscillations in the transmittance and/or reflectance spectra under various illuminants.

Figure 3:
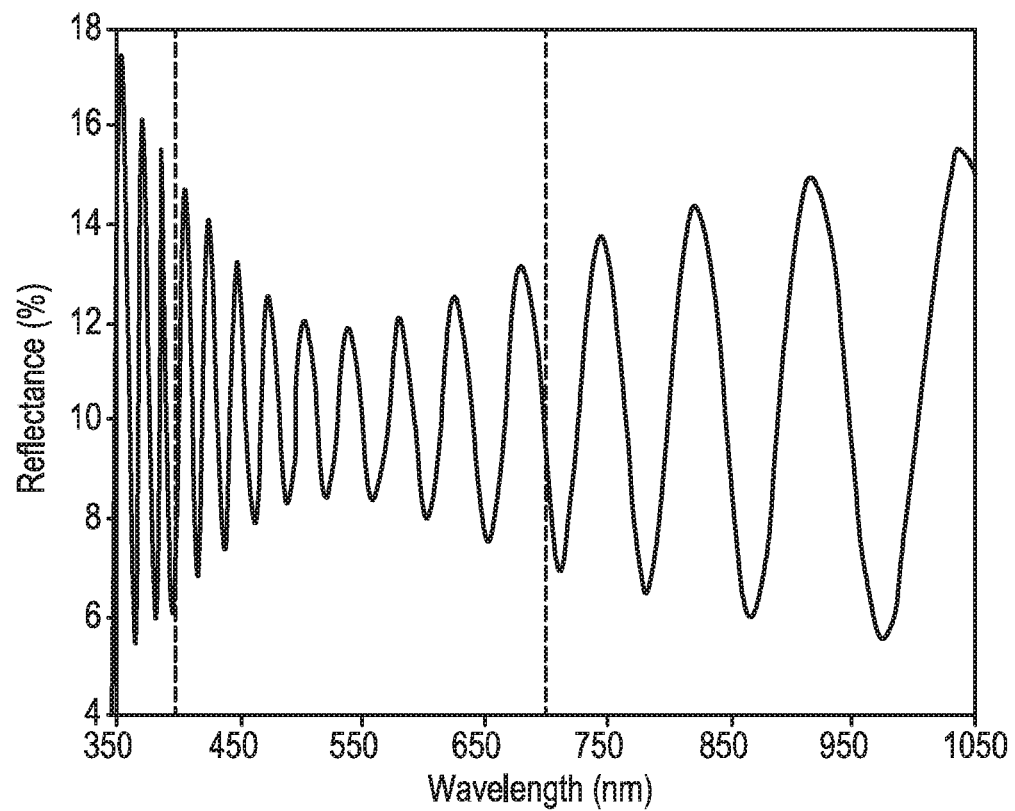
FIG. 3 is a reflectance spectra for the article shown in FIG. 2.

As shown in FIG. 2, a single layer interference layer is included in the depicted article. The article includes an alkali aluminoborosilicate glass substrate 40, a single layer interference layer 50 of $Al_2O_3$ having a physical thickness of about 80 nanometers (nm), a scratch-resistant layer 30 of $Si_uAl_vO_xN_y$ having a physical thickness of about 2000 nm, and a layer 60 of $SiO_2$ having a physical thickness of about 10 nm. FIG. 3 shows a modeled reflectance spectrum for the article illustrated in FIG. 2. The spectrum exhibits oscillations over the optical wavelength regime having amplitudes in the range from about 3.5 percentage points (e.g., a low reflectance of about 8.5% and a peak reflectance of about 12%, at the wavelength range from about 520 nm to 540 nm) to about 8 percentage points (e.g., a low reflectance of about 6.5% and a peak reflectance to about 14.5%, at the wavelength of about 400 nm to 410 nm).

As used herein, the term "amplitude" includes the peak-to-valley change in reflectance or transmittance. As used herein, the term "transmittance" is defined as the percentage of incident optical power within a given wavelength range transmitted through a material (e.g., the article, the substrate or the optical film or portions thereof). The term "reflectance" is similarly defined as the percentage of incident optical power within a given wavelength range that is reflected from a material (e.g., the article, the substrate, or the optical film or portions thereof). Transmittance and reflectance are measured using a specific linewidth. In one or more embodiments, the spectral resolution of the characterization of the transmittance and reflectance is less than 5 nm or 0.02 eV.

Figure 4:
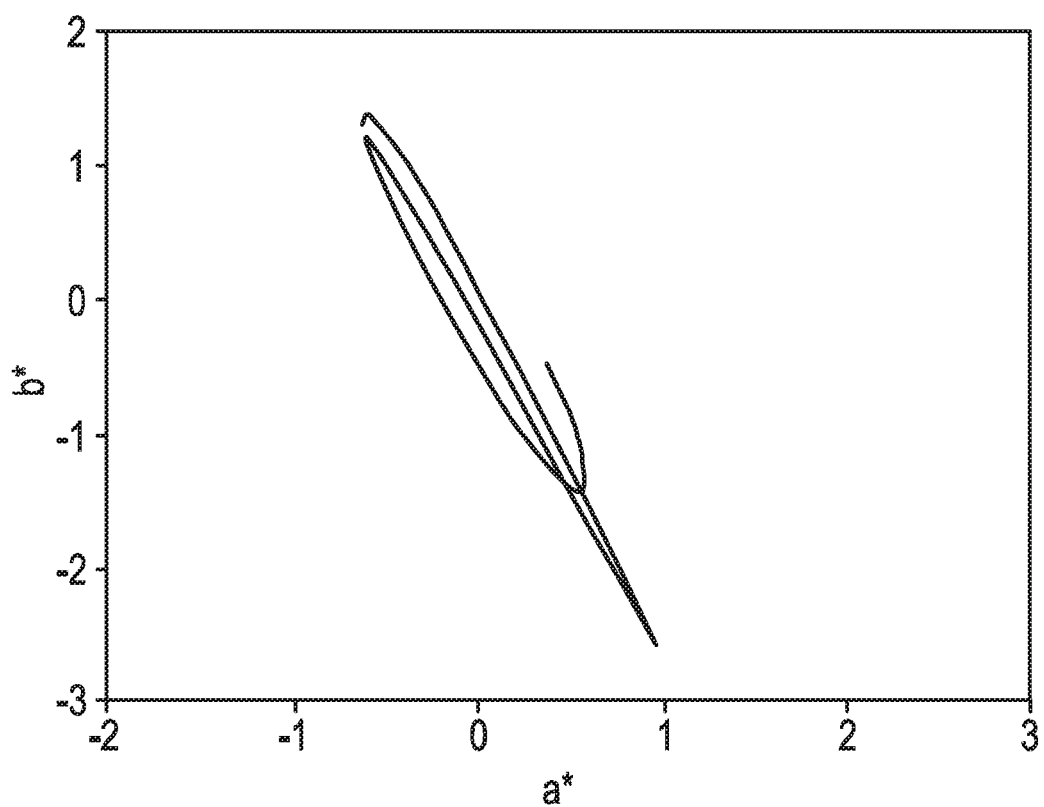
FIG. 4 is a graph showing the range of calculated a* and b* color shifts based on the reflectance spectra shown in FIG. 3.

The phrase "average amplitude" includes the peak-to-valley change in reflectance or transmittance averaged over every possible 100 nm wavelength range within the optical wavelength regime. As used herein, the "optical wavelength regime" includes the wavelength range from about 420 nm to about 700 nm. From this information, it can be predicted that the article shown in FIGS. 1 and 2 will exhibit relatively large color shifts when viewed at different incident illumination angles from normal incidence under different illuminants, as shown in FIG. 4.

In contrast to the articles depicted in FIGS. 1 and 2, the embodiments of this disclosure are optical articles and structures that utilize stacks having a number, N, of bi-layers or multi-layers with differing compositions and/or differing microstructures such that the articles and structures demonstrate high hardness (i.e., a property that can indicate improved or enhanced scratch-resistance) without a loss in optical properties associated with an underlying, substantially transparent substrate. In some aspects, the number, N, of such bi-layers or multi-layers ranges from a value of 10 to 2000, and each of the bi-layers or multi-layers has a thickness on the order of about 0.5 nanometers to about 3 nanometers. In other aspects, each of the bi-layers or multi-layers has a thickness on the order of about 0.5 nanometers to about 50 nanometers. The stacks of multiple bi-layers or multi-layers of the optical articles and structures of the disclosure can produce a super-hardening effect without a concomitant loss in optical properties (such as increased absorption).

Figure 5:
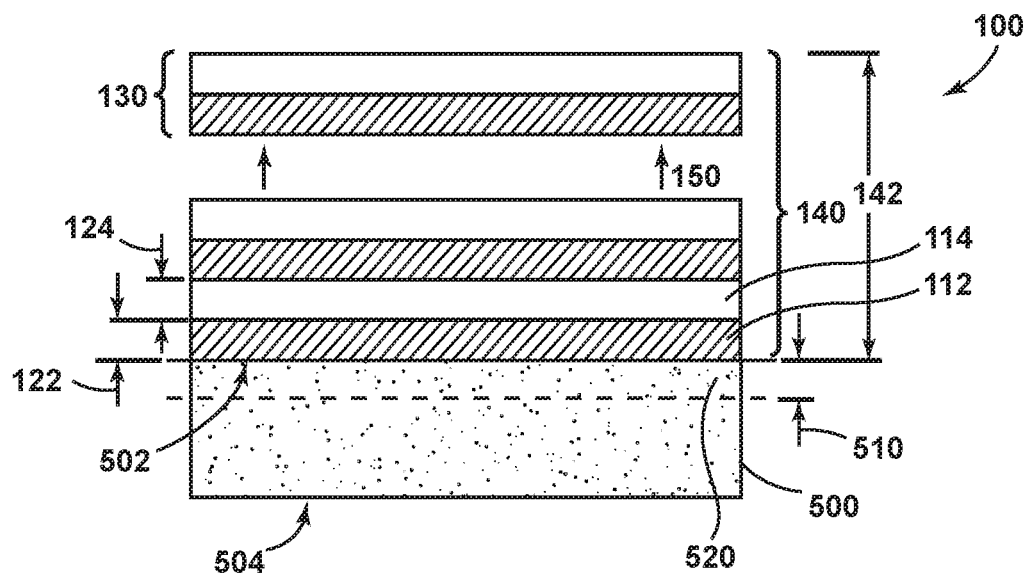
FIG. 5 is a schematic representation of an optically transparent article with a substantially transparent substrate and a stack of N bi-layers according to an embodiment.

As depicted in FIG. 5, one aspect of the present disclosure pertains to an optical structure 140 for a substrate 500 including a stack of N (element 150 as shown) of bi-layers 130, N being set at a value of two or more and the stack having a thickness 142 of at least 5 nm. As shown, substrate 500 has a first primary surface 502 and a second primary surface 504. Each bi-layer 130 is defined by (a) a first layer 112; and (b) a second layer 114 disposed on the first layer 112, the layers 112 and 114 having either one or both of a different composition from one another or a different microstructure from one another. As shown, the first layer 112 has a thickness 122 and the second layer 114 has a thickness 124.

Further, the stack employed within the optical structure 140 depicted in FIG. 5 has a stack refractive index between about 1.2 and about 2.2 and a stack hardness of 15 GPa or greater, the stack hardness measured with a Berkovich Indenter Hardness Test along an indentation depth in the range from about 10% to 50% of the thickness of the stack 142, when the stack is disposed on a glass test substrate having a hardness between 6.5 and 8 GPa.

Another aspect of the disclosure relates to the optical structure 140 depicted in FIG. 5 with a substrate 500 including a stack of N (element 150) bi-layers 130, N being set at a value of two or more and the stack having a thickness 142 of at least 5 nm. In this aspect, each bi-layer 130 is defined by (a) a first layer 112; and (b) a second layer 114 disposed on the first layer 112, the layers 112 and 114 having either one or both a different composition from one another and a different microstructure from one another.

The first layer 112 employed in the foregoing optical structures 140 can possess a composition that includes silicon aluminum oxynitride, silicon oxynitride, aluminum oxynitride, silicon nitride, aluminum nitride, silicon aluminum nitride, boron nitride, tin oxide, zirconium oxide, titanium oxide, silicon oxide, calcium oxide, aluminum oxide, boron oxide, magnesium oxide, barium fluoride, or calcium fluoride. In some aspects, the first layer 112 can possess a composition that includes oxides, nitrides and fluorides of alkaline earth and transition metals, boron, tin, and combinations thereof. In these optical structures 140, the second layer 114 can comprise any of the foregoing materials, provided that it exhibits a different composition and/or microstructure from the first layer 112. For example, the first layer 112 can have a composition that includes magnesium oxide and the second layer 114 has a composition that includes aluminum oxynitride. In another example, the first layer 112 has a composition that includes aluminum nitride and the second layer 114 has a composition that includes silicon aluminum oxynitride. In a further example, the first layer has a composition that includes aluminum nitride and the second layer 114 has a composition that includes aluminum aluminum oxynitride. Additionally or alternatively, the first layer 112 and the second layer 114 may have the same composition but have different microstructures from one another.

Example stacks and optical structures 140 include bi-layers 130 having the following first layer 112/second layer 114 compositions: $TiN/SiO_2$, $TiN/Al_2O_3$, $ZrN/AlO_xN_y$, and $TiN/Si_3N_4$. Other combinations of first layer 112/second layer 114 compositions for the stacks and optical structures 140 include: $MgO/AlO_xN_y$, $MgO/AlN$, $MgO/Si_uAl_vO_xN_y$, $ZrN/AlO_xN_y$, $ZrN/Si_uAl_vO_xN_y$, $BaF_2/Si_uAl_vO_xN_y$, $AlN/AlON$, $SiO_2/AlN_y$, $AlN/Si_uAl_vO_xN_y$, $Si_xAl_yN_z/AlN$, $SiO_2/AlO_xN_y$, and $AlN/Al_2O_3$. Further, the respective combinations of the first and second layers 112, 114 in the foregoing exemplary embodiments can be reversed within the bi-layers 130 of the optical structures 140.

In certain aspects of the foregoing optical structures 140, each of the bi-layers 130 exhibits a thickness (i.e., the sum of the thicknesses 122 and 124) on the order of about 10 nm or less. In certain instances, the thickness of the bi-layers 130 is about 10 nm, 9 nm, 8 nm, 7 nm, 6 nm, 5 nm, 4 nm, 3 nm, 2 nm, 1 nm or less. In certain preferred embodiments, the thicknesses 122 and 124 of each of the layers of the bi-layers 130 ranges from about 0.5 nm to 3 nm, for example, 1 nm, 1.25 nm, 1.5 nm, 1.75 nm, 2.0 nm, 2.25 nm, 2.5 nm, 2.75 nm, up to 3 nm, and all values therebetween. In certain aspects, the thicknesses 122 and 124 of each of the layers can range from about 0.5 nm to about 50 nm. Further, the thicknesses of the bi-layers 130 may be the same as one another or differ from one another. In some instances, all of the first layers 112 of the bi-layers 130 may have the same thicknesses as each other, and all of the second layers 114 may have the same thicknesses as one another. In such embodiments, the thickness of the first layers 112 may be the same or differ from the thicknesses of the second layers 114. Similarly, the number of bi-layers 130, N (element 150 in FIG. 5), can significantly increase up to 2000 in certain instances, particularly as the thickness of the bi-layers 130 decreases. In certain aspects of the foregoing, the number, N, of bi-layers 130 ranges from 10 to 2000.

The optical structures 140 according to the foregoing aspects can demonstrate a super-hardening effect that is manifested in hardness levels in excess of the hardness values associated with each of the layers 112 and 114 that make up each of the bi-layers 130 of the stack 140. For example, the hardness of the stack 140 can reach 18 GPa, or greater, even though the hardness levels of each of the individual layers 112 and/or 114 does not reach such levels. In some cases, the hardness of the stack 140 can reach 20 GPa or greater, 21 GPa or greater, 22 GPa or greater, 23 GPa or greater, 24 GPa or greater, 25 GPa or greater, 26 GPa or greater, or even 26 GPa or greater, again despite the hardness levels of each of the individual layers 112 and/or 114 not reaching such levels.

The super-hardening effects observed in the foregoing optical structures 140 can also be achieved without a significant loss in optical properties associated with articles employing such optical structures and substantially transparent substrates. In some cases, the optical properties are retained via the control of the refractive index of the stack 140 to values between about 1.2 and 2.2, which are relatively close to the refractive indices typical of substantially transparent substrates 500 according to the disclosure. In other cases, an additional layer (or layers) having a lower refractive index can be incorporated into the stack 140 to reduce the total refractive index of the stack 140 without a significant deleterious effect on the hardness levels achieved by the stack. In other cases, the refractive index of the stack 140 is held to a value between about 1.2 and 1.7. In some embodiments, the refractive index of the stack differs in magnitude from the refractive index of the substrate by about 0.8 or less, about 0.7 or less, about 0.6 or less, about 0.5 or less, about 0.4 or less, about 0.3 or less, about 0.2 or less or about 0.1 or less. As a non-limiting example of such retained optical properties, the optical transmissivity of the stack 140 can reach 90% or greater within the visible spectrum; consequently, the stack 140 of the optical structure has a negligible effect on the overall optical properties of the substrate (e.g., substrate 500) beneath the optical structure.

According to one aspect of the disclosure, stacks and optical structures 140 employed by the article 100 can employ a first layer 112 within the bi-layer 130 that serves as a templating layer for the second layer 114 disposed on it. As used herein, a reference to a "templating layer" indicates that the composition and/or microstructure of a layer within the stack influences the composition and/or microstructure of a layer disposed, deposited, formed or otherwise placed on it, particularly at the interface(s) between such a templating layer and the layers disposed on it. For example, the composition and/or microstructure of the first layer 112 can serve as a templating layer that influences the composition and/or microstructure of the second layer 114 disposed on it, particularly at the interface between the layers 112 and 114. For example, the first layer 112 can spur epitaxial growth of the second layer 114, depending on the processing conditions and compositions selected for these layers. It is also believed that in certain aspects, the first layer 112 can serve as a templating layer that introduces dislocations and other nano-sized defects at the interface between the first layer 112 and the second layer 114. These defects, dislocations and other nano-sized features can increase the measured hardness and average hardness of the stack 130 containing such layers. In certain aspects, the first layer 112 has a substantially crystalline microstructure and serves as a templating layer for the second layer 114. In other aspects, the first layer 112 has a partially amorphous microstructure and serves as a templating layer for the second layer 114. In certain cases, microstructure of the second layer 114 develops or forms in part from epitaxial growth from the first layer 112 serving as a templating layer.

A further aspect of the present disclosure pertains to the optically transparent article 100 depicted in FIG. 5 that includes one of the foregoing optical structures 140 and a substantially transparent substrate. More specifically, as shown, the article 100 includes a substantially transparent substrate 500; and a stack 140 of N (element 150) bi-layers 130 on the substrate 500, N being set at a value of two or more and the stack having a thickness 142 of at least 5 nm. As shown, substrate 500 has a first primary surface 502 and a second primary surface 504. Each bi-layer 130 is defined by (a) a first layer 112; and (b) a second layer 114 disposed on the first layer 112, the layers 112 and 114 having either one or both of a different composition from one another and a different microstructure from one another.

In addition, the stack 140 depicted in FIG. 5 includes a stack refractive index between about 100% and about 150% of a refractive index of the substrate 500, and a stack hardness of 15 GPa or greater as measured with a Berkovich Indenter Hardness Test along an indentation depth in the range from about 10% to about 50% of the thickness of the stack 142, when the stack is disposed on a glass test substrate having a hardness between 6.5 and 8 GPa. According to some embodiments, the stack 140 includes a stack refractive index between about 100% and about 140%, between about 100% and about 130%, between about 100% and about 120%, or between 100% and about 110%, for example, of a refractive index of the substrate 500. In some of these embodiments, the article 100 exhibits an article hardness of 15 GPa or greater as measured with a Berkovich Indenter Hardness Test along an indentation depth in the range from about 10% to about 50% of the thickness of the stack 142.

Figure 6:
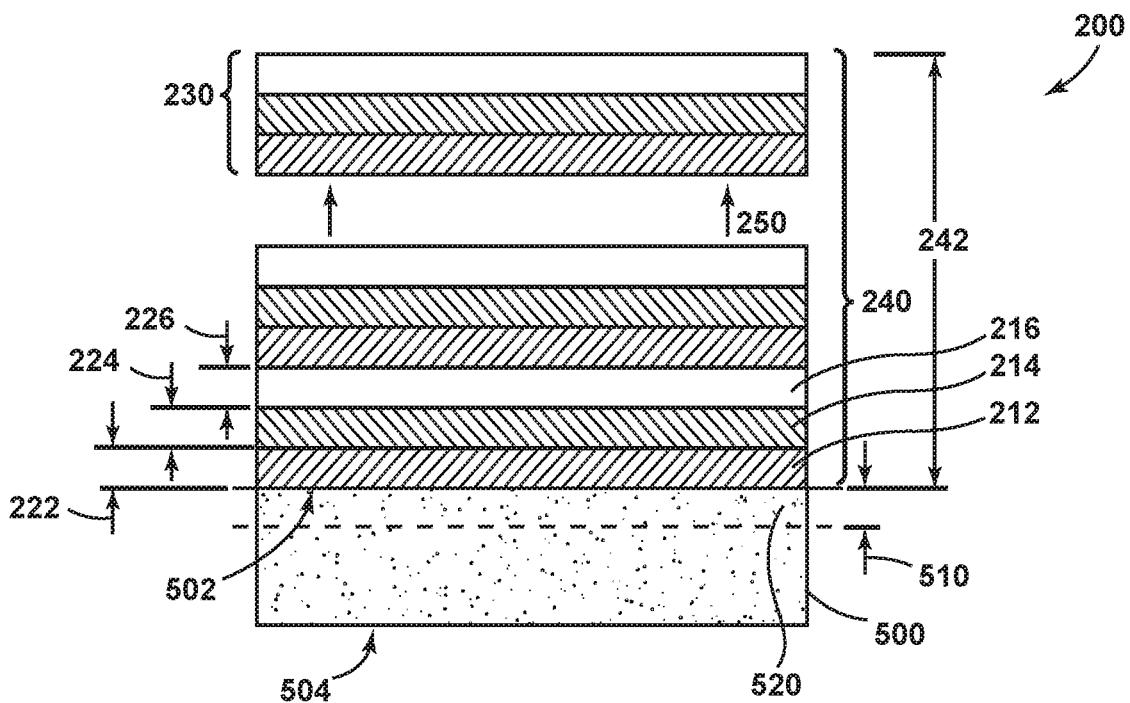
FIG. 6 is a schematic representation of an optically transparent article with a substantially transparent substrate and a stack of N multi-layers according to a further embodiment.

In another aspect, an optically transparent article 200 is depicted in FIG. 6 that includes a stack 240 of N (element 250 as shown in FIG. 6) multi-layers 230, N being set at a value from 2 to 2000 and the stack 240 having a thickness 242 of at least 5 nm. The optically transparent article 200 also includes a substantially transparent substrate, e.g., substrate 500 as shown in FIG. 6. As shown, substrate 500 has a first primary surface 502 and a second primary surface 504. In some aspects, the stack 240 constitutes an optical structure that can be employed with and/or disposed on a substrate, such as substrate 500 depicted in FIG. 6.

Each multi-layer 230 of the stack 240 employed in the optically transparent article 200 depicted in FIG. 6 includes: (a) a first layer 212; (b) a second layer 214 disposed on the first layer 212; and (c) a third layer 216 disposed on the second layer 214, the layers 212, 214 and 216 having either one or both a different composition from at least one of the other layers and a different microstructure from at least one of the other layers. For example, one of the layers 212, 214 or 216 may have a different composition and/or microstructure relative to the other layers. In some aspects, multi-layer 230 can employ more than three layers. Often, various sequences of layers are employed within each multi-layer 230 to achieve a particular, aggregate refractive index for the multi-layer 230, while achieve super-hardness levels.

As shown in FIG. 6, the first layer 212 has a thickness 222, the second layer 214 has a thickness 224, and the third layer 216 has a thickness 226. In addition, the stack 240 depicted in FIG. 6 has a stack refractive index between about 1.2 and 2.2 and a stack hardness of 15 GPa or greater as measured with a Berkovich Indenter Hardness Test along an indentation depth in the range from about 10% to about 50% of the thickness of the stack 242, when the stack is disposed on a glass test substrate having a hardness between 6.5 and 8 GPa. In some embodiments, the article 200 exhibits an article hardness of 15 GPa or greater as measured with a Berkovich Indenter Hardness Test along an indentation depth in the range from about 10% to about 50% of the thickness of the stack 242.

The first layer 212 employed in the foregoing stack 240 within the optically transparent article 200 depicted in FIG. 6 can possess a composition that includes silicon aluminum oxynitride, silicon oxynitride, aluminum oxynitride, silicon nitride, aluminum nitride, silicon aluminum nitride, boron nitride, tin oxide, zirconium oxide, titanium oxide, silicon oxide, calcium oxide, aluminum oxide, boron oxide, magnesium oxide, barium fluoride, or calcium fluoride. In some aspects, the first layer 212 can possess a composition that includes oxides, nitrides and fluorides of alkaline earth and transition metals, boron, tin, and combinations thereof. In these stacks 240 (and optical structures) employed with the article 200, the second and third layers 214 and 216 can comprise any of the foregoing materials, provided that at least one of the layers 214 and 216 exhibits a different composition and/or microstructure selected for the first layer 212. For example, the first layer 212 can have a composition that includes magnesium oxide, the second layer 214 has a composition that includes aluminum oxynitride and the third layer has a composition that includes magnesium oxide. In another example, the first layer 212 has a composition that includes aluminum nitride, the second layer 214 has a composition that includes silicon aluminum oxynitride, and the third layer 216 has a composition that includes aluminum nitride. In one example, a multi-layer 230 employs layers 212, 214 and 216 having the following composition: $BaF_2/MgO/SiAlON$. In another example, a multi-layer 230 employs layers 212, 214 and 216 having the following composition: $Si_xAl_yN_z/AlN/Si_uAl_vO_xN_y$. Further, the respective combinations of the layers 212, 214 and 216 in the foregoing exemplary embodiments can be re-arranged within the multi-layers 230 of the stacks and optical structures 240.

In certain aspects of the foregoing optical structures and stacks 240, each of the multi-layers 230 exhibits a thickness (i.e., the sum of the thicknesses 222, 224 and 226) on the order of about 10 nm or less. In certain instances, the thickness of the multi-layers 230 is about 10 nm, 9 nm, 8 nm, 7 nm, 6 nm, 5 nm, 4 nm, 3 nm, 2 nm, 1 nm or less. In certain preferred embodiments, the thicknesses 222, 224 and 226 of each of the layers of the multi-layers 230 ranges from about 0.5 nm to 3 nm, for example, 1 nm, 1.25 nm, 1.5 nm, 1.75 nm, 2.0 nm, 2.25 nm, 2.5 nm, 2.75 nm, up to 3 nm, and all values therebetween. In certain aspects, the thicknesses 222, 224 and 226 of each of the layers can range from about 0.5 nm to about 50 nm.

Similarly, the number of multi-layers 230, N (i.e., element 250 in FIG. 6) in the stacks 240, can significantly increase, reaching 2000 in certain instances, particularly as the thickness 242 of the multi-layers 230 decreases. Similarly, the number, N, of multi-layers 230 can decrease, particularly as the thickness of the 242 of the multi-layers 230 increases. In some cases, the thickness 242 of the multi-layers 230 can increase when more than three layers constitute each multi-layer 230. In certain aspects of the foregoing, the number, N, of multi-layers 230 ranges from 10 to 2000.

The optical structures and stacks 240 according to the foregoing aspects can demonstrate a super-hardening effect that is manifested in hardness levels in excess of the hardness values associated with each of the layers 212, 214 and 216 (and any additional layers) that make up each of the multi-layers 230 of the stack 240. For example, the hardness of the stack 240 can reach 18 GPa or greater, even though the hardness levels of the individual layers 212, 214 and/or 216 does not reach such levels. In some cases, the hardness of the stack 240 can reach 22 GPa or greater, 24 GPa or greater, or even 26 GPa or greater, again despite the hardness levels of the individual layers 212, 214 and/or 216 not reaching such levels. According to some aspects, the super-hardening effects observed in the stacks 240 are attributed to multi-layers 230 possessing one more layers 212, 214 and 216 that function as a templating layer, as described in the foregoing.

The super-hardening effects observed in the foregoing optical structures and stacks 240 can also be achieved without a significant loss in optical properties associated with articles employing such optical structures and substantially transparent substrates. In some cases, the optical properties are retained via the control of the refractive index of the stack 240 to values between about 1.2 and 2.2, which are relatively close to the refractive indices typical of substantially transparent substrates 500 according to the disclosure. In other cases, an additional layer (or layers) having a lower refractive index can be incorporated into the stack 240 to reduce the total refractive index of the stack 240 without a significant deleterious effect on the hardness levels achieved by the stack. In some other embodiments, the refractive index of the stack differs in magnitude from the refractive index of the substrate by about 0.8 or less, about 0.7 or less, 0.6 or less, by about 0.5 or less, about 0.4 or less, about 0.3 or less, about 0.2 or less or about 0.1 or less. In certain cases, the refractive index of the stack 240 is held to a value between about 1.2 and 1.7. As a non-limiting example of such retained optical properties, the optical transmissivity of the stack 240 can reach 90% or greater within the visible spectrum; consequently, the stack 240 of the optical structure has a negligible effect on the overall optical properties of the substrate (e.g., substrate 500) beneath the optical structure.

In some aspects of the disclosure, the optical articles 100 and 200 (as depicted in exemplary fashion in FIGS. 5 and 6) pertain to articles that exhibit colorlessness even when viewed at different incident illumination angles under an illuminant. In one or more embodiments, the articles 100 and 200 exhibit a color shift of about 2 or less for any incidental illumination angles in the ranges provided herein. As used herein, the phrase "color shift" refers to the change in both a* and b* values, under the CIE L*, a*, b* colorimetry system, in reflectance or transmittance. The a* and b* values are described as transmittance color (or transmittance color coordinates) or reflectance color (or reflectance color coordinates), respectively. Color shift may be determined using the following equation: $\sqrt{((a^*_2-a^*_1)^2+(b^*_2-b^*_1)^2)}$, a* and b* coordinates (in transmittance or reflectance) of the article when viewed at a first incident illumination angle (e.g., normal incidence or 0 degrees, 5 degrees, 10 degrees, 15 degrees, 30 degrees, 40 degrees, or 45 degrees from normal incidence) (i.e., $a^*_1$, and $b^*_1$) and when viewed at a second incident illumination angle (i.e., $a^*_2$, and $b^*_2$), provided that the second incident illumination angle is different from the first incident illumination angle and by at least about 2 degrees, about 5 degrees, about 10 degrees, about 15 degrees, about 20 degrees, about 25 degrees, 30 degrees, or 45 degrees). Measurements of the various colors over a collection of different observers indicate that the average observer sees a just-noticeable difference in the two colors when the color shift is of about 2.

In some instances, a color shift of about 2 or less (in reflectance, in transmittance or in both reflectance and transmittance) is exhibited by the articles 100 and 200 when viewed at various second incident illumination angles, under an illuminant. In some instances the color shift (in reflectance, in transmittance or in both reflectance and transmittance) is about 1.9 or less, 1.8 or less, 1.7 or less, 1.6 or less, 1.5 or less, 1.4 or less, 1.3 or less, 1.2 or less, 1.1 or less, 1 or less, 0.9 or less, 0.8 or less, 0.7 or less, 0.6 or less, 0.5 or less, 0.4 or less, 0.3 or less, 0.2 or less, or 0.1 or less. In some embodiments, the color shift may be about 0. The illuminant can include standard illuminants as determined by the CIE, including A illuminants (representing tungsten-filament lighting), B illuminants (representing daylight simulating illuminants), C illuminants (representing daylight simulating illuminants), D series illuminants (representing natural daylight), and F series illuminants (representing various types of fluorescent lighting). In specific examples, the articles exhibit a color shift of about 2 or less (in reflectance, in transmittance or in both reflectance and transmittance) when viewed at a second incident illumination angle under a CIE F2, F10, F11, F12 or D65 illuminant. The difference between the first incident illumination angle and the second incident illumination angle may be in the range from about 0 degrees to about 80 degrees, from about 0 degrees to about 75 degrees, from about 0 degrees to about 70 degrees, from about 0 degrees to about 65 degrees, from about 0 degrees to about 60 degrees, from about 0 degrees to about 55 degrees, from about 0 degrees to about 50 degrees, from about 0 degrees to about 45 degrees, from about 0 degrees to about 40 degrees, from about 0 degrees to about 35 degrees, from about 0 degrees to about 30 degrees, from about 0 degrees to about 25 degrees, from about 0 degrees to about 20 degrees, from about 0 degrees to about 15 degrees, from about 5 degrees to about 80 degrees, from about 5 degrees to about 80 degrees, from about 5 degrees to about 70 degrees, from about 5 degrees to about 65 degrees, from about 5 degrees to about 60 degrees, from about 5 degrees to about 55 degrees, from about 5 degrees to about 50 degrees, from about 5 degrees to about 45 degrees, from about 5 degrees to about 40 degrees, from about 5 degrees to about 35 degrees, from about 5 degrees to about 30 degrees, from about 5 degrees to about 25 degrees, from about 5 degrees to about 20 degrees, from about 5 degrees to about 15 degrees, and all ranges and sub-ranges therebetween. The article may exhibit the maximum color shifts described herein between normal incidence and along all the second incident illumination angles in the range from about 0 degrees to about 80 degrees away from normal incidence. In one example, the article may exhibit a color shift of 2 or less between normal incidence and at any second incident illumination angle in the range from about 0 degrees to about 60 degrees, from about 2 degrees to about 60 degrees, or from about 5 degrees to about 60 degrees away from normal incidence. The article may exhibit the maximum color shifts described herein between a first incident illumination angle greater than about 10 degrees from normal incidence (e.g., 10 degrees, 20 degrees, 30 degrees, 40 degrees, 50 degrees) and all the incident illumination angles in the range from about 15 degrees to about 80 degrees away from normal incidence. In one example, the article may exhibit a color shift of 2 or less between a first incident illumination angle greater than about 10 degrees from normal (e.g., 10 degrees, 20 degrees, 30 degrees, 40 degrees, 50 degrees) and at any second incident illumination angle in the range from about 10 degrees to about 60 degrees, from about 15 degrees to about 60 degrees, or from about 30 degrees to about 60 degrees away from normal incidence.

According to one or more embodiments, the articles 100 and 200 can exhibit an average transmittance of 85% or greater over the visible spectrum. In certain instances, the articles 100 and 200 can exhibit an average transmittance of 86%, 87%, 88%, 89%, 90%, 91%, 92%, 93%, 94%, and levels in excess of 95%. In certain aspects, the transmittance of the stacks within these articles can be tailored as desired (e.g., in view of the transmissivity of the substrate) by adjusting the refractive index and/or thickness of each of the layers employed in the bi-layers or multi-layers making up each stack. In one or more embodiments, the articles 100 and 200 have a total reflectance of 15% or less. As used herein, the term "transmittance" is defined as the percentage of incident optical power within a given wavelength range transmitted through a material (e.g., the article, the substrate or the optical film or portions thereof). The tem "reflectance" is similarly defined as the percentage of incident optical power within a given wavelength range that is reflected from a material (e.g., the article, the substrate, or the optical film or portions thereof). Transmittance and reflectance are measured using a specific linewidth. In one or more embodiments, the spectral resolution of the characterization of the transmittance and reflectance is less than 5 nm or 0.02 eV.

Referring to FIGS. 5 and 6, the articles 100 and 200 according to one or more embodiments may include respective stacks 140 or 240, each stack containing N (elements 150 or 250) bi-layers 130 or multi-layers 230. The layers employed in these bi-layers 130 and 230 (e.g., layer 112, 212, etc.) can possess different compositions and/or microstructures. Further, the term "layer" may include a single layer or may include one or more sub-layers. Such sub-layers may be in direct contact with one another. The sub-layers may be formed from the same material or two or more different materials. In one or more alternative embodiments, such sub-layers may have intervening layers of different materials disposed therebetween. In one or more embodiments a layer may include one or more contiguous and uninterrupted layers and/or one or more discontinuous and interrupted layers (i.e., a layer having different materials formed adjacent to one another). A layer (e.g., layer 112, 212, etc.) or sub-layers may be formed by any known method in the art, including discrete deposition or continuous deposition processes. In one or more embodiments, the layer may be formed using only continuous deposition processes, or, alternatively, only discrete deposition processes.

As used herein, the term "dispose" includes coating, depositing and/or forming a material onto a surface using any known method in the art. The disposed material may constitute a layer, as defined herein. The phrase "disposed on" includes the instance of forming a material onto a surface such that the material is in direct contact with the surface and also includes the instance where the material is formed on a surface, with one or more intervening material(s) is between the disposed material and the surface. The intervening material(s) may constitute a layer, as defined herein.

The articles 100 and 200 described herein have scratch resistance, which may be characterized by or otherwise manifested by a measured hardness of the article (or the measured hardness of the optical film, which may include a scratch resistant layer, as described herein). The hardness values provided herein, with respect to the articles 100 and 200 and the stacks, may be measured by a "Berkovich Indenter Hardness Test", which includes measuring the hardness of a material on a surface thereof by indenting the surface with a diamond Berkovich indenter. The Berkovich Indenter Hardness Test includes indenting the respective stacks 140, 240 (when disposed on a test substrate) and/or articles 100 and 200 (which include a stack) with the diamond Berkovich indenter to form an indent to an indentation depth in the range from about 5 nm to about 1000 nm, depending on the thickness 142, 242 of the stacks 140, 240. In some aspects of the disclosure, the indentation depth is set in the range from about 10% to about 50% of the thickness 142, 242 of the stacks 140, 240. The indentation depth may also be set at the entire thickness 142, 242 of the stacks 140, 240, in some aspects. In most aspects, the indentation depth is made and measured from the top surface of the uppermost layer employed in the stacks 140, 240 of the articles 100, 200.

As used herein, the terms "hardness" and "maximum hardness," without any other descriptor, refer to a maximum measured hardness value, and not an average of the measured hardness values. Ultimately, the Berkovich Indenter Hardness Test includes measuring the maximum hardness from this indentation along the entire indentation depth range or a segment of this indentation depth (e.g., in the range from about 100 nm to about 600 nm), generally using the methods set forth in Oliver, W. C., and Pharr, G. M., "An improved technique for determining hardness and elastic modulus using load and displacement sensing indentation experiments," *J. Mater. Res.*, Vol. 7, No. 6, 1992, 1564-1583; and Oliver, W. C., and Pharr, G. M., "Measurement of Hardness and Elastic Modulus by Instrument Indentation: Advances in Understanding and Refinements to Methodology," *J. Mater. Res.*, Vol. 19, No. 1, 2004, 3-20. Both of the above references authored by Oliver, W. C. and Pharr, G. M. are incorporated by reference herein for their salient teachings in view of this disclosure.

Typically, in nanoindentation measurement methods (such as by using a Berkovich indenter) of a coating or film that is harder than the underlying substrate, the measured hardness may appear to increase initially at very shallow subsurface indentation depths due to development of the plastic zone at these depths, then increase, and then reach a maximum value or plateau at deeper indentation depths. Thereafter, the measured hardness begins to decrease at even deeper indentation depths due to the effect of the underlying substrate. Where a substrate having an increased hardness compared to the coating is utilized, the same effect can be seen; however, the hardness increases at deeper indentation depths due to the effect of the underlying substrate.

The indentation depth range and the hardness values at certain indentation depth range(s) can be selected to identify a particular hardness response of the stacks 140, 240 and layers thereof, described herein, without the effect of the underlying substrate (e.g., substrate 500). When measuring the hardness of the stacks or layers thereof (when disposed on a substrate) with a Berkovich indenter, the region of permanent deformation (plastic zone) of a material is associated with the hardness of the material. During indentation, an elastic stress field extends well beyond this region of permanent deformation. As indentation depth increases, the apparent hardness and modulus are influenced by stress field interactions with the underlying substrate. The substrate influence on hardness occurs at deeper indentation depths (i.e., typically at depths greater than about 50% of the optical film structure or layer thickness). Moreover, a further complication is that the hardness response requires a certain minimum load to develop full plasticity during the indentation process. Prior to that certain minimum load, the hardness shows a generally increasing trend.

At small indentation depths (which also may be characterized as small loads) (e.g., up to about 100 nm, or less than 10% of the thickness of the stack), the apparent hardness of a material appears to increase dramatically versus indentation depth. This small indentation depth regime does not represent a true metric of hardness but instead, reflects the development of the aforementioned plastic zone, which is related to the finite radius of curvature of the indenter. At intermediate indentation depths (e.g., typically between about 10% and 50% of the thickness of the stack), the apparent hardness approaches maximum levels. At deeper indentation depths, the influence of the substrate becomes more pronounced as the indentation depths increase. As noted earlier, the measured hardness may begin to drop dramatically once the indentation depth exceeds about 50% of the optical film structure thickness or the layer thickness.

It has been observed that the hardness measured at intermediate indentation depths (at which hardness approaches and is maintained at maximum levels) and at deeper indentation depths depends on the thickness of a material or layer. Specifically, the hardness response of four different layers (i.e., 500 nm thick, 1000 nm thick, 1500 nm thick, and 2000 nm thick) of $AlO_xN_y$ having different thicknesses was evaluated. The hardness of each layer was measured using the Berkovich Indenter Hardness Test. The 500 nm-thick layer exhibited its maximum hardness at indentation depths from about 100 nm to 180 nm, followed by a dramatic decrease in hardness at indentation depths from about 180 nm to about 200 nm, indicating the hardness of the substrate influencing the hardness measurement. The 1000 nm-thick layer exhibited a maximum hardness at indentation depths from about 100 nm to about 300 nm, followed by a dramatic decrease in hardness at indentation depths greater than about 300 nm. The 1500 nm-thick layer exhibited a maximum hardness at indentation depths from about 100 nm to about 550 nm and the 2000-nm thick layer exhibited a maximum hardness at indentation depths from about 100 nm to about 600 nm.

In some embodiments, the stacks 140, 240 employed in the articles 100, 200 and/or the layer(s) within the stacks exhibit a maximum hardness at indentation depths greater than about 100 nm or greater than about 200 nm and thus exhibit sufficient hardness to provide scratch resistance, that is not influenced by the substrate. In some embodiments, the stacks 140, 240 employed in the articles 100, 200 and/or the layer(s) within the stacks have a maximum hardness at such indentation depths and thus are resistant to specific scratches such as microductile scratches (which typically have depths of about 100 nm to about 500 nm or from about 200 nm to about 400 nm).

According to some aspects of the disclosure, the hardness of the stacks 140, 240 employed in the articles 100, 200 may be maximized or otherwise optimized by tuning the thickness of the layers contained within these features.

In one or more embodiments, the stacks 140, 240 of the articles 100, 200 exhibit a hardness of about 10 GPa or greater, about 15 GPa or greater, about 18 GPa or greater, or about 20 GPa or greater, as measured by the Berkovich Indenter Hardness test. In some embodiments, the hardness of the stacks 130, 230 may be in the range from about 5 GPa to about 30 GPa, from about 6 GPa to about 30 GPa, from about 7 GPa to about 30 GPa, from about 8 GPa to about 30 GPa, from about 9 GPa to about 30 GPa, from about 10 GPa to about 30 GPa, from about 12 GPa to about 30 GPa, from about 5 GPa to about 28 GPa, from about 5 GPa to about 26 GPa, from about 5 GPa to about 24 GPa, from about 5 GPa to about 22 GPa, from about 5 GPa to about 20 GPa, from about 12 GPa to about 25 GPa, from about 15 GPa to about 25 GPa, from about 16 GPa to about 24 GPa, from about 18 GPa to about 22 GPa, from about 18 GPa to about 24 GPa, from about 18 GPa to about 26 GPa, from about 18 GPa to about 28 GPa, from about 18 GPa to about 30 GPa, and all ranges and sub-ranges between the foregoing ranges. These hardness values may be present at indentation depths of about 50 nm or greater, or about 100 nm or greater (e.g., from about 100 nm to about 300 nm, from about 100 nm to about 400 nm, from about 100 nm to about 500 nm, from about 100 nm to about 600 nm, from about 200 nm to about 300 nm, from about 200 nm to about 400 nm, from about 200 nm to about 500 nm, or from about 200 nm to about 600 nm).

In one or more embodiments, articles 100, 200 also exhibit abrasion resistance. Specifically, one or more embodiments of the articles described herein exhibit resistance to scratches and other damage formed by abrasion (or multiple contact events). Various forms of abrasion test are known in the art, such as that specified in ASTM D1044-99, using abrasive media supplied by Taber Industries. Modified abrasion methods related to ASTM D1044-99 can be created using different types of abrading media, abradant geometry and motion, pressure, etc. in order to provide repeatable and measurable abrasion or wear tracks to meaningfully differentiate the abrasion resistance of different samples. For example, different test conditions will usually be appropriate for soft plastics vs. hard inorganic test samples. The embodiments described herein exhibit scratch resistance as measured by a specific modified version of the ASTM D1044-99 test referred to herein as the "Taber Test," or a "Garnet Test," which provide clear and repeatable differentiation of durability between different samples, which comprise primarily hard inorganic materials. These test methods may generate a combination of micro-ductile scratches together with other damage modes mentioned above, depending on the specific sample tested.

As used herein, the phrase "Taber Test" refers to a test method using a Taber Linear Abraser 5750 (TLA 5750) and accessories supplied by Taber Industries, in an environment including a temperature of about 22° C.±3° C. and Relative Humidity of up to about 70%. The TLA 5750 includes a CS-17 abraser material having a 6.7 mm diameter abraser head. Each sample was abraded according to the Taber Test and the abrasive damage was evaluated using both Haze and Bidirectional Transmittance Distribution Function (BTDF) measurements, among other methods. In the Taber Test, the procedure for abrading each sample includes placing the TLA 5750 and a flat sample support on a rigid, flat surface and securing the TLA 5750 and the sample support to the surface. Before each sample is abraded under the Taber Test, the abraser material (CS-17) is refaced using a new S-14 refacing strip adhered to glass. The abraser is subjected to 10 refacing cycles using a cycle speed of 25 cycles/minute and stroke length of 1 inch, with no additional weight added (i.e., a total weight of about 350 g is used during refacing, which is the combined weight of the spindle and collet holding the abraser). The procedure then includes operating the TLA 5750 to abrade the sample, where the sample is placed in the sample support in contact with the abraser head and supporting the weight applied to the abraser head, using a cycle speed of 25 cycles/minute, and a stroke length of 1 inch, and a weight such that the total weight applied to the sample is 850 g (i.e., a 500 g auxiliary weight is applied in addition to the 350 g combined weight of the spindle and collet). The procedure includes forming two wear tracks on each sample for repeatability, and abrading each sample for 500 cycle counts in each of the two wear tracks on each sample.

In one or more embodiments, the top-most surface of the stacks 140, 240 is abraded according to the above Taber Test and the articles 100, 200 containing these stacks exhibits a haze of about 5% or less, as measured on the abraded side using a hazemeter supplied by BYK Gardner under the trademark Haze-Gard Plus®, using an aperture over the source port, the aperture having a diameter of 8 mm. In some embodiments, the haze measured after the Taber Test may be about 4% or less, about 3% or less, about 2% or less, about 1% or less, about 0.8% or less, about 0.5% or less, about 0.4% or less, about 0.3%, about 0.2% or less, or about 0.1% or less.

In one or more embodiments, the top-most surface of the stacks 140, 240 employed in the articles 100, 200 may exhibit an abrasion resistance, after being abraded by the Taber Test as measured by a light scattering measurement. In one or more embodiments, the light scattering measurement includes a bi-directional reflectance distribution function (BRDF) or bi-directional transmittance distribution function (BTDF) measurement carried out using a Radiant Zemax IS-SA™ instrument. This instrument has the flexibility to measure light scattering using any input angle from normal to about 85 degrees incidence in reflection, and from normal to about 85 degrees incidence in transmission, while also capturing all scattered light output in either reflection or transmission into 2*Pi steradians (a full hemisphere in reflection or transmission). In one embodiment, the article 100, 200 exhibits an abrasion resistance, as measured using BTDF at normal incidence and analyzing the transmitted scattered light at a selected angular range, for example from about 10° to about 80° degrees in polar angles and any angular range therein. The full azimuthal range of angles can be analyzed and integrated, or particular azimuthal angular slices can be selected, for example from about 0° and 90° azimuthally. In the case of linear abrasion an azimuthal direction that is substantially orthogonal to the abrasion direction may be utilized so as to increase signal-to-noise of the optical scattering measurement. In one or more embodiments, the article may exhibit a scattered light intensity after the Taber Test as measured at the coated surface 101, of about less than about 0.1, about 0.05 or less, about 0.03 or less, about 0.02 or less, about 0.01 or less, about 0.005 or less, or about 0.003 or less (in units of 1/steradian), when using the Radiant Zemax IS-SA tool in CCBTDF mode at normal incidence in transmission, with a 2 mm aperture and a monochrometer set to 600 nm wavelength, and when evaluated at polar scattering angles in the range from about 15° to about 60° (e.g., specifically, about 20°). Normal incidence in transmission may be otherwise known as zero degrees in transmission, which may be denoted as 180° incidence by the instrument software. In one or more embodiments, the scattered light intensity may be measured along an azimuthal direction substantially orthogonal to the abraded direction of a sample abraded by the Taber Test. These optical intensity values may also correspond to less than about 1%, less than about 0.5%, less than about 0.2%, or less than about 0.1% of the input light intensity that is scattered into polar scattering angles greater than about 5 degrees, greater than about 10 degrees, greater than about 30 degrees, or greater than about 45 degrees.

Generally speaking, BTDF testing at normal incidence, as described herein, is closely related to the transmission haze measurement, in that both are measuring the amount of light that is scattered in transmission through a sample (or, in this case the article, after abrading the coated surface 101). BTDF measurements provide more sensitivity as well as more detailed angular information, compared to haze measurements. BTDF allows measurement of scattering into different polar and azimuthal angles, for example allowing us to selectively evaluate the scattering into azimuthal angles that are substantially orthogonal to the abrasion direction in the linear Taber test (these are the angles where light scattering from linear abrasion is the highest). Transmission haze is essentially the integration of all scattered light measured by normal incidence BTDF into the entire hemisphere of polar angles greater than about +/−2.5 degrees.

The Garnet Test uses the same apparatus as the Taber Test (i.e., a Taber linear abraser, or an equivalent apparatus). The Garnet Test includes using a 150-grit garnet sandpaper to abrade the sample surface under varying applied loads for one reciprocation cycle (i.e., one forward-and-back cycle), with a stroke length of 1" and a speed of 45 cycles/minute. The loads applied are in terms of a total load (including the weight of the abraser spindle, holder, and any added weights). The garnet sandpaper has a contact area with the samples of about 7 mm, similar to the Taber test. The Garnet Test performed in this way is generally more aggressive than the Taber Test and can produce a wider variety of damage modes. The visible scratches and damage are also more random. Light scattering from these samples can be characterized using BTDF and Haze measurements as described above.

In one or more embodiments, the article 100, 200 and/or the stack 140, 240 contained therein exhibits a haze of about 3% or less (e.g., about 2% or less, about 1% or less, about 0.5% or less, or about 0.2% or less) after the Garnet Test, when tested in the Garnet Test with a total load in the range from about 380 g to about 2100 g. The articles of one or more embodiment exhibit a scattered light level at a polar angle of 20 degrees (orthogonal to abrasion axis, as measured by CC-BTDF) of about 0.04 or less, about 0.02 or less, about 0.01 or less, or even about 0.005 or less, in units of 1/steradian.

According to one or more embodiments, the article 100, 200 and/or the stack 140, 240 exhibits an average light transmission of about 80% or greater. The term "light transmission" refers to the amount of light that is transmitted through a medium. The measure of light transmission is the difference between the amount of light that enters the medium and the amount of light that exits the medium. In other words, light transmission is the light that has traveled through a medium without being absorbed or scattered. The term "average light transmission" refers to spectral average of the light transmission multiplied by the luminous efficiency function, as described by CIE standard observer. The article 100 of specific embodiments may exhibit an average light transmission of 80% or greater, 82% or greater, 85% or greater, 90% or greater, 90.5% or greater, 91% or greater, 91.5% or greater, 92% or greater, 92.5% or greater, 93% or greater, 93.5% or greater, 94% or greater, 94.5% or greater, or 95% or greater.

In one or more embodiments, the article 100, 200 and/or the stack 140, 240 contained therein has a total reflectivity that 20% or less. For example, the article may have a total reflectivity of 20% or less, 15%, or less, 10% or less, 9% or less, 8% or less, 7% or less, 6% or less. In some specific embodiments, the article has a total reflectivity of 6.9% or less, 6.8% or less, 6.7% or less, 6.6% or less, 6.5% or less, 6.4% or less, 6.3% or less, 6.2% or less, 6.1% or less, 6.0% or less, 5.9% or less, 5.8% or less, 5.7% or less, 5.6% or less, or 5.5% or less. In accordance with one or more embodiments, the stack 140, 240 of the article 100, 200 has a total reflectivity that is the same or less than the total reflectivity of the substrate 500. In one or more embodiments, the article 100, 200 exhibits a relatively flat transmittance spectrum, reflectance spectrum or transmittance and reflectance spectrum over the optical wavelength regime. In some embodiments, the relatively flat transmittance and/or reflectance spectrum includes an average oscillation amplitude of about 5 percentage points or less along the entire optical wavelength regime or wavelength range segments in the optical wavelength regime. Wavelength range segments may be about 50 nm, about 100 nm, about 200 nm or about 300 nm. In some embodiments, the average oscillation amplitude may be about 4.5 percentage points or less, about 4 percentage points or less, about 3.5 percentage points or less, about 3 percentage points or less, about 2.5 percentage points or less, about 2 percentage points or less, about 1.75 percentage points or less, about 1.5 percentage points or less, about 1.25 percentage points or less, about 1 percentage point or less, about 0.75 percentage points or less, about 0.5 percentage points of less, about 0.25 percentage points or less, or about 0 percentage points, and all ranges and sub-ranges therebetween. In one or more specific embodiments, the article exhibits a transmittance over a selected wavelength range segment of about 100 nm or 200 nm over the optical wavelength regime, wherein the oscillations from the spectra have a maximum peak of about 80%, about 82%, about 84%, about 86%, about 87%, about 88%, about 89%, about 90%, about 91%, about 92%, about 93%, about 94%, or about 95%, and all ranges and sub-ranges therebetween.

In some embodiments, the relatively flat average transmittance and/or average reflectance includes maximum oscillation amplitude, expressed as a percent of the average transmittance or average reflectance, along a specified wavelength range segment in the optical wavelength regime. The average transmittance or average reflectance would also be measured along the same specified wavelength range segment in the optical wavelength regime. The wavelength range segment may be about 50 nm, about 100 nm or about 200 nm. In one or more embodiments, the article 100, 200 exhibits an average transmittance and/or average reflectance with an average oscillation amplitude of about 10% or less, about 5% or less, about 4.5% of less, about 4% or less, about 3.5% or less, about 3% or less, about 2.5% or less, about 2% or less, about 1.75% or less, about 1.5% or less, about 1.25% or less, about 1% or less, about 0.75% or less, about 0.5% or less, about 0.25% or less, or about 0.1% or less, and all ranges and sub-ranges therebetween. Such percent-based average oscillation amplitude may be exhibited by the article 100, 200 and/or the stack 140, 240 contained therein along wavelength ranges segments of about 50 nm, about 100 nm, about 200 nm or about 300 nm, in the optical wavelength regime. For example, an article may exhibit an average transmittance of about 85% along the wavelength range from about 500 nm to about 600 nm, which is a wavelength range segment of about 100 nm, within the optical wavelength regime. The article may also exhibit a percent-based oscillation amplitude of about 3% along the same wavelength range (500 nm to about 600 nm), which means that along the wavelength range from 500 nm to 600 nm, the absolute (non-percent-based) oscillation amplitude is about 2.55 percentage points.

Substrate

The substrate 500 may be inorganic and may include an amorphous substrate, a crystalline substrate or a combination thereof. The substrate 500 may be formed from manmade materials and/or naturally occurring materials. In some specific embodiments, the substrate 500 may specifically exclude plastic and/or metal substrates. In some embodiments, the substrate 500 may be organic and specifically polymeric. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins.

In one or more embodiments, the substrate 500 exhibits a refractive index in the range from about 1.4 to 1.6, preferably between 1.45 to about 1.55.

According to some embodiments, the substrate 500 may be characterized as having a hardness that is less than the hardness of the stack, as both are measured by the Berkovich Indenter Test. In certain preferred embodiments, the substrate 500 can possess a glass composition and have a hardness from about 6.5 GPa to about 8 GPa. As noted earlier, other compositions for the substrate 500 can be employed in the optical structures and articles of the disclosure with hardness values below 6.5 GPa or above 8 GPa; however, in such instances, changes to the indentation depth may be necessary to obtain a maximum hardness of a stack disposed on such substrates.

In specific embodiments, the substrate 500 may exhibit an average strain-to-failure at a surface on one or more opposing major surface (e.g., primary surfaces 502, 504) that is 0.5% or greater, 0.6% or greater, 0.7% or greater, 0.8% or greater, 0.9% or greater, 1% or greater, 1.1% or greater, 1.2% or greater, 1.3% or greater, 1.4% or greater 1.5% or greater or even 2% or greater, as measured using ball-on-ring testing using at least 5, at least 10, at least 15, or at least 20 samples. In specific embodiments, the substrate 500 may exhibit an average strain-to-failure at its surface on one or more opposing major surface of about 1.2%, about 1.4%, about 1.6%, about 1.8%, about 2.2%, about 2.4%, about 2.6%, about 2.8%, or about 3% or greater.

Suitable substrates 500 may exhibit an elastic modulus (or Young's modulus) in the range from about 5 GPa to about 120 GPa. In certain aspects, the elastic modulus of the substrate can range from 5 GPa to about 30 GPa, and all values therebetween within this range. In other instances, the elastic modulus of the substrate may be in the range from about 30 GPa to about 110 GPa, from about 30 GPa to about 100 GPa, from about 30 GPa to about 90 GPa, from about 30 GPa to about 80 GPa, from about 30 GPa to about 70 GPa, from about 40 GPa to about 120 GPa, from about 50 GPa to about 120 GPa, from about 60 GPa to about 120 GPa, from about 70 GPa to about 120 GPa, and all ranges and sub-ranges therebetween.

In one or more embodiments, the substrate 500 may be amorphous and may include glass, which may be strengthened or non-strengthened. Examples of suitable glass include soda lime glass, alkali aluminosilicate glass, alkali containing borosilicate glass and alkali aluminoborosilicate glass. In some variants, the glass may be free of lithia. In one or more alternative embodiments, the substrate 500 may include crystalline substrates such as glass ceramic substrates (which may be strengthened or non-strengthened) or may include a single crystal structure, such as sapphire. In one or more specific embodiments, the substrate 500 includes an amorphous base (e.g., glass) and a crystalline cladding (e.g., sapphire layer, a polycrystalline alumina layer and/or or a spinel ($MgAl_2O_4$) layer).

The substrate 500 may be substantially planar or sheet-like, although other embodiments may utilize a curved or otherwise shaped or sculpted substrate. In many aspects of the disclosure, the substrate 500 is substantially optically clear, transparent and free from light scattering. In such embodiments, the substrate 500 may exhibit an average light transmission over the optical wavelength regime of about 85% or greater, about 86% or greater, about 87% or greater, about 88% or greater, about 89% or greater, about 90% or greater, about 91% or greater or about 92% or greater. In one or more alternative embodiments, the substrate 500 may be opaque or exhibit an average light transmission over the optical wavelength regime of less than about 10%, less than about 9%, less than about 8%, less than about 7%, less than about 6%, less than about 5%, less than about 4%, less than about 3%, less than about 2%, less than about 1%, or less than about 0%. In addition, substrate 500 may optionally exhibit a color, such as white, black, red, blue, green, yellow, orange etc.

Additionally or alternatively, the physical thickness of the substrate 500 may vary along one or more of its dimensions for aesthetic and/or functional reasons. For example, the edges of the substrate 500 may be thicker as compared to more central regions of the substrate 500. The length, width and physical thickness dimensions of the substrate 500 may also vary according to the application or use of the article 100, 200.

The substrate 500 may be provided using a variety of different processes. For instance, where the substrate 500 includes an amorphous substrate such as glass, various forming methods can include float glass processes and down-draw processes such as fusion draw and slot draw.

Once formed, a substrate 500 may be strengthened to form a strengthened substrate. In certain aspects, the substrate 500 will include a compressive stress region 520 (see FIGS. 5 and 6) that spans from the first primary surface 502 to a depth 510. In certain aspects, such a compressive stress region can alternatively be employed on the other primary surface 504 or along one or more edges of the substrate. As used herein, the term "strengthened substrate" may refer to a substrate that has been chemically strengthened, for example through ion-exchange of larger ions for smaller ions in the surface of the substrate. However, other strengthening methods known in the art, such as thermal tempering, or utilizing a mismatch of the coefficient of thermal expansion between portions of the substrate to create compressive stress and central tension regions, may be utilized to form strengthened substrates.

Where the substrate 500 is chemically strengthened by an ion exchange process, the ions in the surface layer of the substrate (e.g., within the compressive stress region 520) are replaced by—or exchanged with—larger ions having the same valence or oxidation state. Ion exchange processes are typically carried out by immersing a substrate 500 in a molten salt bath containing the larger ions to be exchanged with the smaller ions in the substrate. It will be appreciated by those skilled in the art that parameters for the ion exchange process, including, but not limited to, bath composition and temperature, immersion time, the number of immersions of the substrate in a salt bath (or baths), use of multiple salt baths, additional steps such as annealing, washing, and the like, are generally determined by the composition of the substrate and the desired compressive stress (CS), depth of compressive stress layer (or depth of layer), e.g., the depth 510 of the compressive stress region 520, of the substrate 500 that result from the strengthening operation. By way of example, ion exchange of alkali metal-containing glass substrates may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 40 hours. However, temperatures and immersion times different from those described above may also be used.

In addition, non-limiting examples of ion exchange processes in which glass substrates, e.g., substrates 500, are immersed in multiple ion exchange baths, with washing and/or annealing steps between immersions, are described in U.S. patent application Ser. No. 12/500,650, filed Jul. 10, 2009, now issued as U.S. Pat. No. 8,561,429, by Douglas C. Allan et al., entitled "Glass with Compressive Surface for Consumer Applications" and claiming priority from U.S. Provisional Patent Application No. 61/079,995, filed Jul. 11, 2008, in which glass substrates are strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which glass substrates are strengthened by ion exchange in a first bath is diluted with an effluent ion, followed by immersion in a second bath having a smaller concentration of the effluent ion than the first bath. The contents of U.S. Pat. Nos. 8,561,429 and 8,312,739 are incorporated herein by reference in their entirety.

The degree of chemical strengthening achieved by ion exchange may be quantified based on the parameters of central tension (CT), surface CS, and depth of layer (DOL). Surface CS may be measured near the surface or within the strengthened glass at various depths. A maximum CS value may include the measured CS at the surface (CS) of the strengthened substrate. The CT, which is computed for the inner region adjacent the compressive stress layer within a glass substrate, can be calculated from the CS, the physical thickness t, and the DOL. CS and DOL are measured using those means known in the art. Such means include, but are not limited to, measurement of surface stress (FSM) using commercially available instruments such as the FSM-6000, manufactured by Luceo Co., Ltd. (Tokyo, Japan), or the like, and methods of measuring CS and DOL are described in ASTM 1422C-99, entitled "Standard Specification for Chemically Strengthened Flat Glass," and ASTM 1279.19779 "Standard Test Method for Non-Destructive Photoelastic Measurement of Edge and Surface Stresses in Annealed, Heat-Strengthened, and Fully-Tempered Flat Glass," the contents of which are incorporated herein by reference in their entirety. Surface stress measurements rely upon the accurate measurement of the stress optical coefficient (SOC), which is related to the birefringence of the glass substrate. SOC in turn is measured by those methods that are known in the art, such as fiber and four point bend methods, both of which are described in ASTM standard C770-98 (2008), entitled "Standard Test Method for Measurement of Glass Stress-Optical Coefficient," the contents of which are incorporated herein by reference in their entirety, and a bulk cylinder method. The relationship between CS and CT is given by the expression (1):

$$CT=(CS \cdot DOL)/(t-2DOL) \quad (1),$$

wherein t is the physical thickness (μm) of the glass article. In various sections of the disclosure, CT and CS are expressed herein in megaPascals (MPa), physical thickness t is expressed in either micrometers (μm) or millimeters (mm) and DOL is expressed in micrometers (μm).

In one embodiment, a strengthened substrate 500 can have a surface CS (e.g., at a first primary surface 502) of 200 MPa or greater, 250 MPa or greater, 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater. The strengthened substrate may have a DOL of 10 μm or greater, 15 μm or greater, 20 μm or greater (e.g., 25 μm, 30 μm, 35 μm, 40 μm, 45 μm, 50 μm or greater) and/or a CT of 10 MPa or greater, 20 MPa or greater, 30 MPa or greater, 40 MPa or greater (e.g., 42 MPa, 45 MPa, or 50 MPa or greater) but less than 100 MPa (e.g., 95, 90, 85, 80, 75, 70, 65, 60, 55 MPa or less). In one or more specific embodiments, the strengthened substrate 500 has one or more of the following: a surface CS greater than 500 MPa, a DOL greater than 15 μm, and a CT greater than 18 MPa.

Example glasses that may be used in the substrate 500 may include alkali aluminosilicate glass compositions or alkali aluminoborosilicate glass compositions, though other glass compositions are contemplated. Such glass compositions are capable of being chemically strengthened by an ion exchange process. One example glass composition comprises $SiO_2$, $B_2O_3$ and $Na_2O$, where $(SiO_2+B_2O_3) \geq 66$ mol. %, and $Na_2O \geq 9$ mol. %. In an embodiment, the glass composition includes at least 6 wt. % aluminum oxide. In a further embodiment, the substrate 500 includes a glass composition with one or more alkaline earth oxides, such that a content of alkaline earth oxides is at least 5 wt. %. Suitable glass compositions, in some embodiments, further comprise at least one of $K_2O$, $MgO$, and $CaO$. In a particular embodiment, the glass compositions used in the substrate can comprise 61-75 mol. % SiO2; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO.

A further example glass composition suitable for the substrate 500 comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; where 12 mol. % $\leq (Li_2O+Na_2O+K_2O) \leq 20$ mol. % and 0 mol. % $\leq (MgO+CaO) \leq 10$ mol. %.

A still further example glass composition suitable for the substrate 500 comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. % $\leq (Li_2O+Na_2O+K_2O) \leq 18$ mol. % and 2 mol. % $\leq (MgO+CaO) \leq 7$ mol. %.

In a particular embodiment, an alkali aluminosilicate glass composition suitable for the substrate 500 comprises alumina, at least one alkali metal and, in some embodiments, greater than 50 mol. % $SiO_2$, in other embodiments at least 58 mol. % $SiO_2$, and in still other embodiments at least 60 mol. % $SiO_2$, wherein the ratio $[(Al_2O_3+B_2O_3)/\Sigma \text{ modifiers}] > 1$ also governs and the components are expressed in mol. % and the $\Sigma$ modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio $[(Al_2O_3+B_2O_3)/\Sigma \text{ modifiers}] > 1$ governs.

In still another embodiment, the substrate 500 may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO, wherein: 66 mol. % $\leq SiO_2+B_2O_3+CaO \leq 69$ mol. %; $Na_2O+K_2O+B_2O_3+MgO+CaO+SrO > 10$ mol. %; 5 mol. % $\leq MgO+CaO+SrO \leq 8$ mol. %; $(Na_2O+B_2O_3)-Al_2O_3 \leq 2$ mol. %; 2 mol. % $Na_2O-Al_2O_3 \leq 6$ mol. %; and 4 mol. % $\leq (Na_2O+K_2O)-Al_2O_3 \leq 10$ mol. %.

In an alternative embodiment, the substrate may comprise an alkali aluminosilicate glass composition comprising: 2 mol % or more of $Al_2O_3$ and/or $ZrO_2$, or 4 mol % or more of $Al_2O_3$ and/or $ZrO_2$.

Where the substrate 500 includes a crystalline substrate, the substrate may include a single crystal, which may include $Al_2O_3$. Such single crystal substrates are referred to as sapphire. Other suitable materials for a crystalline substrate include polycrystalline alumina layer and/or spinel ($MgAl_2O_4$).

Optionally, the crystalline substrate 500 may include a glass ceramic substrate, which may be strengthened or non-strengthened. Examples of suitable glass ceramics may include $Li_2O$—$Al_2O_3$—$SiO_2$ system (i.e. LAS-System) glass ceramics, $MgO$—$Al_2O_3$—$SiO_2$ system (i.e. MAS-System) glass ceramics, and/or glass ceramics that include a predominant crystal phase including β-quartz solid solution, β-spodumene ss, cordierite, and lithium disilicate. The glass ceramic substrates may be strengthened using the chemical strengthening processes disclosed herein. In one or more embodiments, MAS-System glass ceramic substrates may be strengthened in $Li_2SO_4$ molten salt, whereby an exchange of $2Li^+$ for $Mg^{2+}$ can occur.

The substrate 500, according to one or more embodiments, can have a physical thickness ranging from about 100 μm to about 5 mm. Example substrate 500 physical thicknesses range from about 100 μm to about 500 μm (e.g., 100, 200, 300, 400 or 500 μm). Further example substrate 110 physical thicknesses range from about 500 μm to about 1000 μm (e.g., 500, 600, 700, 800, 900 or 1000 μm). The substrate 500 may have a physical thickness greater than about 1 mm (e.g., about 2, 3, 4, or 5 mm). In one or more specific embodiments, the substrate 500 may have a physical thickness of 2 mm or less or less than 1 mm. In certain aspects, the substrate 500 may be acid-polished or otherwise treated to remove or reduce the effect of surface flaws.

Stack of N Layers

As shown in FIGS. 5-6, the stack 140, 240 includes a plurality of respective bi-layers 130 or multi-layers 230. Moreover, in some embodiments, one or more films or layers may be disposed on the opposite side of the substrate 500 from the stack 140, 240 (i.e., on primary surface 504).

The physical thickness 142, 242 of the stack 140, 240 may be in the range from about 5 nm to about 3 μm. In certain aspects, the thickness 142, 242 of the stacks 140, 240 can range from 0.1 μm to about 3 μm. In some instances, the physical thickness 142, 242 of the stack 140, 240 may be in the range from about 0.1 μm to about 2.9 μm, from about 0.1 μm to about 2.8 μm, from about 0.1 μm to about 2.7 μm, from about 0.1 μm to about 2.6 μm, from about 0.1 μm to about 2.5 μm, from about 0.1 μm to about 2.4 μm, from about 0.1 μm to about 2.3 μm, from about 0.1 μm to about 2.2 μm, from about 0.1 μm to about 2.1 μm, from about 0.1 μm to about 2 μm, from about 0.5 μm to about 3 μm, from about 1 μm to about 3 μm, from about 1.1 μm to about 3 μm, from about 1.2 μm to about 3 μm, from about 1.3 μm to about 3 μm, from about 1.4 μm to about 3 μm, or from about 1.5 μm to about 3 μm, and all ranges and sub-ranges therebetween.

The stacks 140, 240 may exhibit a maximum hardness of greater than about 5 GPa, as measured on the top-most layer within these stacks by the Berkovich Indenter Hardness Test. For example, the stacks 140, 240 may exhibit a hardness in the range from about 6 GPa to about 30 GPa, from about 7 GPa to about 30 GPa, from about 8 GPa to about 30 GPa, from about 9 GPa to about 30 GPa, from about 10 GPa to about 30 GPa, from about 12 GPa to about 30 GPa, from about 5 GPa to about 28 GPa, from about 5 GPa to about 26 GPa, from about 5 GPa to about 24 GPa, from about 5 GPa to about 22 GPa, from about 5 GPa to about 20 GPa, from about 12 GPa to about 25 GPa, from about 15 GPa to about 25 GPa, from about 16 GPa to about 24 GPa, from about 18 GPa to about 22 GPa, from about 18 GPa to about 24 GPa, from about 18 GPa to about 26 GPa, from about 18 GPa to about 28 GPa, from about 18 GPa to about 30 GPa, and all ranges and sub-ranges therebetween. In preferable aspects, the maximum hardness of the stacks is at or greater than 15 GPa. When super-hardening effects are particularly prominent in the stacks 140, 240, maximum hardness values can exceed 30 GPa.

Such maximum hardness values associated with the stacks 140, 240 may be exhibited at indentation depths of about 50 nm or greater or about 100 nm or greater. In one or more embodiments, the indentation depths may be in the range from about 100 nm to about 300 nm, from about 100 nm to about 400 nm, from about 100 nm to about 500 nm, from about 100 nm to about 600 nm, from about 200 nm to about 300 nm, from about 200 nm to about 400 nm, from about 200 nm to about 500 nm, or from about 200 nm to about 600 nm. In some aspects of the disclosure, these maximum hardness values may be obtained in an indentation depth from about 10% to about 50% of the thickness 142, 242 of the stacks 140, 240.

According to certain aspects, the stacks 140, 240 can exhibit a very low extinction coefficient, indicative of their optical clarity. For example, the stacks 140, 240 or any one or of the layers within these stacks may exhibit an extinction coefficient (at a wavelength of about 400 nm) of about $10^{-3}$ or less. In certain implementations, the stacks are characterized by an extinction coefficient, k, of zero, or approximately zero, at a wavelength of 400 nm.

The physical and/or optical thicknesses of the bi-layers 130 and multi-layers 230 of the stacks 140, 240 can be adjusted to achieve desired optical and mechanical properties (e.g., hardness). Likewise, the composition and/or microstructures of these layers can also be adjusted to achieve a desired combination of optical and mechanical properties for the articles 100, 200.

The stacks 140, 240 may be formed using various deposition methods such as vacuum deposition techniques, for example, chemical vapor deposition (e.g., plasma enhanced chemical vapor deposition, low-pressure chemical vapor deposition, atmospheric pressure chemical vapor deposition, and plasma-enhanced atmospheric pressure chemical vapor deposition), physical vapor deposition (e.g., reactive or nonreactive sputtering, metal mode sputtering, or laser ablation), thermal or e-beam evaporation and/or atomic layer deposition. One or more layers of the bi-layers 130 and multi-layers 230 of the stacks 140, 240 may include nanopores or mixed-materials to provide specific refractive index ranges or values.

The physical thicknesses of the layers or sub-layers of the optical film stacks 140, 240 may vary by less than about 10 nm, less than about 5 nm, less than about 1 nm or less than about 0.5 nm (representing the range of six standard deviations from the target value) to achieve the maximum targeted repeatability (e.g., a* and b* variations no greater than +/−0.2 for reflected F2 illumination). In some embodiments, larger variations in physical thicknesses of the layers can be tolerated while still achieving the desired targets of the invention for some applications (e.g., a* and b* variations no greater than +/−2.0 for reflected F2 illumination).

High-angle optical performance may be improved in some embodiments by adding additional layers to the stacks 140, 240 of the articles 100, 200. In some cases, these additional layers can extend the wavelengths at which the reflectance spectrum has low amplitude oscillations (e.g., into the near-IR wavelengths, such as to 800 nm, 900 nm, or even 1000 nm). This leads to lower oscillations and lower color at high incidence angles, because generally the entire reflectance spectra of the article shifts to shorter wavelengths at higher light incidence angles. In some cases, this extended-band performance can be achieved by adjusting the interference layer design, for example by allowing a higher oscillation amplitude to achieve a wider-wavelength-band of low oscillations, without necessarily adding more layers. This extended-band or wide-wavelength-band of low oscillations (correlated to an extended band of low reflectance for the interference layers) can also be useful in making the article tolerant to deposition non-uniformity, substrate curvature, substrate sculpting, or substrate shaping which causes shadowing during directional deposition processes, or other geometry factors that cause a substantially uniform relative shift in all layer thicknesses relative to the typically ideal target thicknesses.

The articles 100, 200 disclosed herein may include articles with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. A specific example of articles 100, 200 incorporated into a product is shown in FIG. 7. Specifically, FIG. 7 shows a consumer electronic device 700 including a housing 702 having front 704, back 706, and side surfaces 708, 710; electrical components (not shown) that are at least partially inside or entirely within the housing and including at least a controller, a memory, and a display 712 at or adjacent to the front surface of the housing; and a cover substrate 714 at or over the front surface of the housing such that it is over the display. In some embodiments, the cover substrate 714 may include articles 100, 200. In some embodiments, the housing 702 may include articles 100, 200.

Various methods can be employed to make the optically transparent structures and articles (e.g., articles 100, 200 as depicted in FIGS. 5 and 6) of the disclosure. According to one embodiment, a method of making an optically transparent article (e.g., articles 100, 200 is provided that includes a step of forming or developing a stack 140 or stack 240 of N bi-layers 130 or multi-layers 230, respectively, on a substantially transparent substrate 500, N (i.e., elements 150, 250) being set at a value of two or more and the stack 140, 240 having a thickness of at least 5 nm.

With regard to making an article 100 depicted in FIG. 5, the step of forming or developing the stack 140 of N bi-layers 130 includes sub-steps of: (a) depositing a first layer 112; and (b) depositing a second layer 114 on the first layer 112. Further, the steps of depositing the first and second layers are repeated N (see element 150 in FIG. 5) times, and the first and second layers 112 and 114 have at least one of different compositions and different microstructures. In addition, the stack 140 has a stack refractive index between about 100% and about 150% of a refractive index of the substrate 500, and article 100 has an article hardness of 15 GPa or greater, the article hardness measured on the stack 140 with a Berkovich Indenter Hardness Test along an indentation depth in the range from about 10% to about 50% of the thickness 142 of the stack 140.

With regard to making an article 200 depicted in FIG. 6, the step of forming or developing the stack 240 of N multi-layers 230 can include, for example, sub-steps of: (a) depositing a first layer 212; (b) depositing a second layer 214 on the first layer 212; and (c) depositing a third layer 216 on the second layer 214. Further, the steps of depositing the first, second and third layers are repeated N (see element 250 in FIG. 5) times, and the layers 212, 214 and 216 having at least one of different compositions and different microstructures. In addition, the stack 240 has a stack refractive index between about 100% and about 150% of a refractive index of the substrate 500, and article 200 has an article hardness of 15 GPa or greater, the article hardness measured on the stack 240 with a Berkovich Indenter Hardness Test along an indentation depth in the range from about 10% to about 50% of the thickness 242 of the stack 240.

In the foregoing methods of making the optically transparent articles 100, 200, the forming or developing step can be conducted with a sputtering process including but not limited to a reactive sputtering process. For example, the first layer 112, 212 can have an aluminum nitride composition and the second layer 114, 214 can have an aluminum oxynitride composition, each deposited by employing an aluminum sputter target with and without the flow of oxygen gas during the application of power to the sputter target in a chamber containing the substrate 500 of the articles 100, 200.

In one or more embodiments, the method may utilize a metal mode sputtering process. For example, the method may include depositing first layer of a metal or a metal alloy (such as aluminum, silicon, or an alloy of aluminum silicon), and then reacting the layer of metal or metal alloy with oxygen and/or nitrogen in order to form a metal-oxynitride (such as aluminum nitride or silicon aluminum oxynitride and the like). Similarly, the method may include depositing a metal or alloy such as aluminum followed by reacting that deposited metal or alloy layer to form either aluminum nitride or aluminum oxynitride, which may form one layer of a bilayer structure which contains both aluminum nitride and aluminum oxynitride.

In one or more embodiments, the hardness values achieved using the sputtering processes described herein may be increased further by use of an ion gun with the sputtering system. For example, an ion gun can be used to increase hardness of layers in ion-assisted sputtering deposition.

Various process conditions and parameters can be adjusted according to the foregoing methods of making the optically transparent articles 100, 200. During the forming or developing step, for example, power to one or more sputter targets can be varied to generate a plasma containing one or more cations (e.g., silicon or aluminum). Oxidants can then be introduced into the plasma at various pressures and flow rates to create the desired layer compositions (e.g., aluminum nitride, silicon aluminum oxynitride, etc.). In some embodiments, the pressure during deposition may be in the range from about 1.5 millitorr to about 5 millitorr, although pressures slightly outside of this range may also be utilized. Further, shutters situated over one or more sputter targets can be used to alternate the introduction of particular plasmas into the chamber containing the substrate. Still further, the duration of the pulses can be adjusted to longer or shorter times to produce thicker or thinner layers that make up each of the bi-layers or multi-layers employed in a given stack.

EXAMPLES

Various exemplary embodiments of the optically transparent structures and articles of the disclosure will be further clarified by the following examples. In the following example optical structures, all stacks were deposited onto chemically strengthened glass substrates, supplied by Corning Inc. under the trademark Gorilla® Glass substrates using a reactive sputtering deposition process. The sputtering targets employed in the process were 3 inch diameter targets of silicon and aluminum. Each target had a pneumatically driven shutter which could either prevent deposition of the sputtered material when the shutter was closed, or allow deposition of the sputtered material onto the substrates when the shutter was opened. Each of the example optical structures was located above the sputtering targets during fabrication; accordingly, the deposition approach for these examples is referred to as "sputter up." Further, the sputtering throw distance in the chamber was about 100 mm.

During preparation, the example optical structures were rotated above the sputtering targets in order to improve uniformity. A thermocouple positioned near the substrate holder was used for monitoring temperature near the substrate (~1 mm away). The samples were heated and controlled to hold at 200 degrees Celsius inside the chamber prior to, and during deposition. The chamber used a variable angle gate valve for controlling the pressure. This variable angle valve is a convenience, but is not required to achieve the properties of the bi-layers, multi-layers, films and optical structures of the disclosure. In addition, the deposition chamber employed to prepare the sample optical structures (later detailed in Examples One, Two, Three and Four) used a load lock for transport of the samples into the chamber. The chamber was pumped via a turbomolecular pump. The base pressure of the chamber was about 0.1 microtorr (i.e., a pressure of $10^{-7}$ torr).

An exemplary deposition run employed to fabricate the optical structures of the following Examples follows. Deviations in pressure, gas flows and/or sputtering power may have been employed from run to run, but what follows is the basic framework of the deposition conditions employed in the Examples. A deposition run was typically started by loading samples into the load lock, pumping down the load lock, and then transferring the samples into the deposition chamber. A flow of argon gas (typically at a flow rate of 30 sccm) was started in the deposition chamber and the variable angle gate valve was used to control the pressure to about 30 millitorr. After a pressure of about 30 millitorr stabilized within the chamber, a plasma was then started at each of the sputter targets intended to be used for a particular deposition run (e.g., as used to create a particular Example). The plasma was driven by either or both of DC and RF (at 13.56 MHz) power. Unless otherwise noted, the plasma was driven with 300 watts of DC power superimposed with 200 watts of RF power on a 99.99% pure aluminum target (for layers having an aluminum cation), and 500 watts of DC power on a p-doped Si target (for layers having a silicon cation). Subsequent experiments (not detailed in the following Examples) have revealed that the aluminum target could also be driven with 500 watts of DC power alone, with no superimposed RF power. After the plasma stabilized for about a minute, the pressure was reduced to a deposition pressure using the variable angle gate valve. Deposition pressures between 1.5 millitorr and 5 millitorr were employed for the deposition runs, unless otherwise noted in the following Examples.

After the plasma was stabilized at the deposition pressure, oxidants (i.e., nitrogen or oxygen gas) were introduced into the chamber. Typically, nitrogen gas was introduced at a 30 sccm flow rate, and oxygen gas was introduced at a flow rate from 0.25 to about 3 sccm. As noted in the following tables, these values were changed from one deposition run to another for the particular Examples. Some deposition runs used no oxygen, and some used up to 3 sccm of oxygen. The introduction of the oxidant gasses partially poisoned the sputter target surfaces with nitrogen and oxygen, as could be observed by a decrease in voltage on the power supplies to the magnetrons for the sputter targets. The exact degree of poisoning was not known. After a short stabilization time of about a minute, the shutters to the magnetron targets were opened, allowing the sputtered material to deposit onto the samples (e.g., as deposited initially on the Gorilla® Glass test substrate, and followed by deposition onto the layers making up each bi-layer or multi-layer according to a particular Example).

The superlattices making up the stacks in the optical structures of the Examples were formed or developed according to two approaches. A superlattice of alternating SiAlN and AlN layers, for example, was prepared according to the first approach. The shutter above the silicon target (source of silicon) was alternated between open and shut positions, while the shutter above the aluminum target remained in an open position. This opening and closing momentarily blocked the flux of the silicon and thereby made a film deposit which alternated between AlN and SiAlN layers. A superlattice of alternating AlON and AlN layers, for example, was prepared according to a second approach. To effect this deposition, the shutter above the silicon target was closed and the shutter above the aluminum target was maintained in an open position. During deposition, the flow of oxygen gas was alternated between full flow and no flow states to the reactor, thereby producing the superlattice of alternating AlON and AlN layers.

The rates of deposition of each the layers within the bi-layers or multi-layers of the stacks of the optical structures of the Examples were in the range of about 0.1 to 5 angstroms per second. Therefore, pulses of 2 to 100 seconds for the designated sputter target(s) produced layer thicknesses in the range of about 0.2 to 50 nm. As demonstrated by the following Tables, most of the layers were about 0.5 to 3 nm in thickness, which usually corresponded to pulses in the about 5 to 20 second regime. It is conceivable that those with ordinary skill in the field could employ other sputter deposition approaches and techniques (e.g., with different sputter pulse timings, sputter target powers, pressures and/or gas flows) according to the principles and concepts detailed in this disclosure to produce optical structures comparable to the structures detailed in the following Tables and Examples.

As also noted in the following Tables and Examples, several hundred alternating bi-layers and multi-layers (i.e., N bi-layers or multi-layers) were deposited for a stack in a given Example. For instance, an optical structure prepared with an alternating deposition of individual AlON and AlN layers could be prepared with a total of 780 layers such that these layers were classified as 390 AlON/AlN bi-layers (i.e., N=390). This stack would have a total thickness of about 500 to 2000 nanometers; therefore, each layer would be about 0.64 to about 2.56 nm thick (i.e., 500 nm/780 layers=0.64 nm; and 2000 nm/780 layers=2.56 nm). The individual layer thicknesses can be approximated from the rates of deposition of the individual film materials employed during a particular deposition run. As detailed in the following Examples and Tables, the deposition rate and sputter pulse timing parameters were both varied to produce individual layers within the stacks according to the optical structures of the Examples having a thickness range of about 0.5 to 3 nm. These thickness ranges are consistent with the above estimate in which the total thickness of the superlattice was divided by the number of layers.

Example 1

Example 1 (comparative) reflects various aluminum nitride and aluminum oxynitride single layer thick films that are comparative of the optical structures according to the disclosure (e.g., stacks 140 and 240 depicted in FIGS. 5 and 6). Further, the single layer films of Example 1 are also instructive as to the effect of certain deposition conditions on the formation or development of layers within the stacks of the optical structures of the disclosure (e.g., layers 112 and 114 of the stack 140 and layers 212, 214 and 216 of the stack 240 of FIGS. 5 and 6). Mechanical properties, dimensional data, and optical data associated with the layers in Example 1 are depicted below in Table 1.

2-2 and 2-5 is greater than the 17.4 GPa hardness of Example 1-10 and 16.3 GPa hardness of Example 1-2 (see Table 1) even though these single layer films are deposited

TABLE 1

|  | Film Mat'l | Thickness (nm) | Refractive Index (at 550 nm) | Extinction Coefficient, k (at 400 nm) | Modulus, E (GPa) | Hardness, H (GPa) | Pressure (mTorr) | $O_2$ flow (sccm) |
|---|---|---|---|---|---|---|---|---|
| Ex. 1-1 | AlN | 617 | 2.081 | <0.001 | 255 | 19.4 | 1.5 | 0 |
| Ex. 1-2 | AlN | 568 | 2.071 | <0.001 | 212 | 16.3 | 2 | 0 |
| Ex. 1-3 | AlN | 543 | 2.048 | <0.001 | 192 | 14.1 | 3 | 0 |
| Ex. 1-4 | AlN | 517 | 2.013 | <0.001 | 185 | 12 | 4 | 0 |
| Ex. 1-5 | AlN | 505 | 1.97 | <0.001 | 185 | 12 | 5 | 0 |
| Ex. 1-6 | AlON | 479 | 2.024 | <0.001 | 166 | 15.0 | 2 | 0 |
| Ex. 1-7 | AlON | 494 | 1.941 | <0.001 | 135 | 14.3 | 2 | 0.25 |
| Ex. 1-8 | AlON | 450 | 1.919 | <0.001 | 130 | 13.8 | 2 | 0.5 |
| Ex. 1-9 | AlON | 414 | 1.869 | <0.001 | 129 | 13.6 | 2 | 0.75 |
| Ex. 1-10 | AlON | 935 | 1.979 | <0.001 | 206 | 17.4 | 2 | 0.25 |

As evident from Table 1 above, comparative Examples 1-1 through 1-5 ("Ex. 1-1" through "Ex. 1-5") demonstrate that as the pressure of deposition is increased, the hardness of an individual AlN layer is decreased. Examples 1-6 through 1-9 ("Ex. 1-6" through "Ex. 1-9") demonstrate that as oxygen flow is added to a single layer AlON film material, both the refractive index, n (as measured at 550 nm), and the hardness of that film material decreases. Example 1-10 ("Ex. 1-10") demonstrates the typical Berkovich indenter hardness of about 17.4 GPa obtained from an approximate 1 micron thick (i.e., 935 nm thick) layer of AlON on a test glass substrate.

Example 2

The samples outlined in Example 2 are exemplary of various stacks that can be employed in the optical structures according to the disclosure. The stacks in Example 2 contain bi-layers (e.g., consistent with stacks 140 depicted in FIG. 5) that were produced according to a set of processing runs. Each of the samples in Example 2 employed 390 bi-layers of aluminum nitride and aluminum oxynitride single layer materials (i.e., N=390), such that the total stack consisted of 780 total layers of deposited material. Mechanical properties, dimensional data, and optical data associated with the stacks in Example 2 are depicted below in Table 2.

at the same pressure, 2 millitorr. Examples 2-2 and 2-5 even used more oxygen flow (1.5 sccm) for the AlON layers within the stacks, and AlON is known generally as a softer material compared to AN, especially when formed by sputtering.

As is also evident from Table 2, Examples 2-1 through 2-3 ("Ex. 2-1" through "Ex. 2-3") and Examples 2-4 through 2-6 ("Ex. 2-4" through "Ex. 2-6") demonstrate that the pulse timings (i.e., the "AlN timing" and "AlON timing" in Table 2) for the individual layers of AlN and AlON have an effect on the ultimate hardness of the stack material. In particular, an AlON pulse timing of 10 seconds (Exs. 2-2 and 2-5) appears to produce stacks with the highest hardness values for the two group of stacks produced with a constant AlN pulse timing (Exs. 2-1 to 2-3 with an AlN pulse timing of 20 seconds and Exs. 2-4 to 2-6 with an AlN pulse timing of 10 seconds).

Table 2 also demonstrates that the thickness of AlN/AlON stacks is largely determined by the AlN pulse timing. Yet, as noted above, the total thickness of the stack is not driving the hardness alone. Example 2-8 is indicative of an AlN/AlON stack that is about 2.6 μm (2575 nm) thick. The timing of the AlN pulses is 45 seconds. However, the hardness for this stack is only 15.8 GPa. This is because the individual layers of AlN within the stack of Example 2-8 are too thick to

TABLE 2

|  | Film Mat'l | Thickness (nm) | Refractive Index (at 550 nm) | Extinction Coefficient, k (at 400 nm) | Modulus, E (GPa) | Hardness, H (GPa) | Pressure (mTorr) | $O_2$ flow (sccm) | AlN timing (s) | AlON timing (s) |
|---|---|---|---|---|---|---|---|---|---|---|
| Ex. 2-1 | AlN/AlON | 1163 | 1.98 | <0.001 | 190 | 19.4 | 2 | 1.5 | 20 | 5 |
| Ex. 2-2 | AlN/AlON | 1355 | 1.994 | <0.001 | 212 | 20.4 | 2 | 1.5 | 20 | 10 |
| Ex. 2-3 | AlN/AlON | 1815 | 1.977 | <0.001 | 193 | 18.7 | 2 | 1.5 | 20 | 20 |
| Ex. 2-4 | AlN/AlON | 1115 | 1.98 | <0.001 | 196 | 19.8 | 2 | 1.5 | 10 | 5 |
| Ex. 2-5 | AlN/AlON | 1447 | 1.986 | <0.001 | 215 | 20.4 | 2 | 1.5 | 10 | 10 |
| Ex. 2-6 | AlN/AlON | 1765 | 1.961 | <0.001 | 176 | 17.1 | 2 | 1.5 | 10 | 20 |
| Ex. 2-7 | AlN/AlON | 2022 | 2.01 | <0.001 | 228 | 18 | 2 | 1.5 | 30 | 10 |
| Ex. 2-8 | AlN/AlON | 2575 | 1.99 | <0.001 | 199 | 15.8 | 2 | 1.5 | 45 | 10 |
| Ex. 2-9 | AlN/AlON | 2110 | 2.026 | <0.001 | 185 | 12.5 | 2 | 0.75 | 30 | 10 |
| Ex. 2-10 | AlN/AlON | 828 | 2.011 | <0.001 | 179 | 13.2 | 2 | 0.75 | 25 | 5 |
| Ex. 2-11 | AlN/AlON | 1679 | 1.99 | <0.001 | 204 | 18.1 | 2 | 3 | 30 | 5 |

As evident from Table 2 above, AlN/AlON exemplary stacks (e.g., "Exs. 2-2 and 2-5") have a higher hardness of 20.4 GPa compared to any single layer of AlN or AlON material of Example 1 (see Table 1). In particular, the hardness of 20.4 GPa for the AlN/AlON layers of Examples participate in the superhardening effects observed in Examples 2-1 through 2-6 (i.e., hardness ranging from 17.1 to 20.4 GPa). Similarly, Example 2-7 was prepared with too long of a pulse time for each of the AlN layers, 30 seconds, and only exhibits a hardness of 18 GPa, lower than the hardness observed in Examples 2-1 through 2-5 (i.e., hardness ranging from 18.7 to 20.4 GPa). It appears that there is an optimal timing for the AlN pulse near 10 to 20 seconds at 2 millitorr (e.g., as employed in Exs. 2-1 to 2-6), which would imply an AlN individual layer thickness in the 1 to 3 nanometer range for these AlN/AlON stacks.

As is also evident from Table 2, comparing Examples 2-9 and 2-7, the oxygen flow rates for the AlON pulse also impacts the hardness for the stack. If the flow is too low, then there is not a strong hardening effect (see, e.g., Ex. 2-9 exhibits a hardness of 12.5 GPa with a 0.75 sccm $O_2$ flow rate). On the other hand, it appears that a 1.5 sccm oxygen flow (e.g., as shown by Ex. 2-7, which exhibits a hardness of 18 GPa) is needed in order to form or develop stacks with increased hardness. Further, it appears that higher oxygen gas flow rates can be exploited to reduce the pulse time of the AlON layers to achieve comparable hardness values. Examples 2-11 and 2-7, each with a hardness of about 18 GPa, demonstrate this effect with oxygen gas flow rates of 3 and 1.5 scmm and AlON pulse timings of 5 and 10 seconds, respectively. Hence, if the oxygen flow is increased to 3 sccm, then the pulse time can be shortened, and a similar superhardening effect can be observed.

Example Three

Example 3 (comparative) reflects various single layer silicon aluminum nitride and silicon aluminum oxynitride films that are comparative of the optical structures according to the disclosure (e.g., stacks 140 and 240 depicted in FIGS. 5 and 6). Further, the single layer films of Example 3 are also instructive as to the effect of certain deposition conditions on the formation or development of individual layers within the stacks of the optical structures of the disclosure (e.g., layers 112 and 114 of the stack 140 and layers 212, 214 and 216 of the stack 240 of FIGS. 5 and 6). Mechanical properties, dimensional data, and optical data associated with the layers in Example 3 are depicted below in Table 3.

SiAlON structures and one single layer SiAlN structure. Over a wide range of conditions, a maximum hardness of only 20 GPa for the SiAlON single layer structures and 22 GPa for the SiAlN single layer structure is observed. These hardness values were measured on samples having thicknesses of about one micron and above (e.g., Ex. 3-2 and 3-6).

As is also evident from Table 3, the hardness of the SiAlON single layers increases as the deposition pressure is decreased (see, e.g., "Exs. 3-1" through "Ex. 3-5"). Table 3 also shows that as the oxygen gas flow rate during the deposition is increased from 0 to 1 sccm, the refractive index of the SiAlON film (or SiAlN film at 0 oxygen gas flow rate) is decreased and the hardness of the SiAlON film is decreased (see, e.g., "Exs. 3-6" through "Ex. 3-10"). Further, Examples 3-10 and 3-11 demonstrate that the data (e.g., hardness, modulus and refractive index) is reproducible given that the deposition conditions for the SiAlON were held constant for both of these samples.

Example Four

The samples outlined in Example 4 are exemplary of various stacks that can be employed in the optical structures according to the disclosure. The stacks in Example 4 contain bi-layers and multi-layers (e.g., consistent with stacks 140 and 240 depicted in FIGS. 5 and 6) that were produced according to a set of processing runs. Each of the samples in Example 4 employed 300 bi-layers of aluminum nitride and silicon aluminum oxynitride (silicon aluminum nitride) single layer materials (i.e., N=300) and 300 multi-layers of silicon aluminum oxynitride, aluminum nitride and silicon aluminum nitride (i.e., N=300), such that the total stack consisted of 600 total layers of deposited material (or 900 layers of deposited material for the SiAlON/AlN/SiAlN stack). Mechanical properties, dimensional data, and optical

TABLE 3

| | Film material | Thickness (nm) | Refractive Index (at 550 nm) | Extinction Coefficient, k (at 400 nm) | Modulus, E (GPa) | Hardness, H (GPa) | Pressure (mTorr) | $O_2$ flow (sccm) |
|---|---|---|---|---|---|---|---|---|
| Ex 3-1 | SiAlON | 1039 | 2.012 | <0.001 | 204 | 20.0 | 1.5 | 0.5 |
| Ex 3-2 | SiAlON | 1222 | 2.049 | <0.001 | 236 | 20.0 | 2 | 0.5 |
| Ex 3-3 | SiAlON | 1078 | 2.04 | <0.001 | 232 | 18.9 | 3 | 0.5 |
| Ex 3-4 | SiAlON | 1041 | 2.016 | <0.001 | 203 | 17.7 | 4 | 0.5 |
| Ex 3-5 | SiAlON | 982 | 1.98 | <0.001 | 201 | 16.5 | 5 | 0.5 |
| Ex 3-6 | SiAlN | 1020 | 2.115 | <0.001 | 240 | 22 | 2 | 0 |
| Ex 3-7 | SiAlON | 1017 | 2.075 | <0.001 | 223 | 19.5 | 2 | 0.25 |
| Ex 3-8 | SiAlON | 1008 | 2.046 | <0.001 | 225 | 19.4 | 2 | 0.5 |
| Ex 3-9 | SiAlON | 969 | 2.018 | <0.001 | 205 | 17.7 | 2 | 0.75 |
| Ex 3-10 | SiAlON | 965 | 1.981 | <0.001 | 195 | 16.3 | 2 | 1 |
| Ex 3-11 | SiAlON | 996 | 1.974 | <0.001 | 192 | 16.2 | 2 | 1 |

As demonstrated by Table 3, Examples 3-1 through 3-11 ("Ex. 3-1" through "Ex. 3-11") are indicative of single layer data associated with the stacks in Example 4 are depicted below in Table 4.

TABLE 4

| | Film mat'l | Thick. (nm) | n (at 550 nm) | k (at 400 nm) | E (GPa) | H (GPa) | P (mTorr) | $O_2$ flow (sccm) | SiAlON timing (s) | AlN timing (s) | SiAlN timing (s) |
|---|---|---|---|---|---|---|---|---|---|---|---|
| Ex 4-1 | AlN/SiAlON | 583 | 2.097 | <0.001 | 208 | 21.8 | 1.5 | 0.5 | 10 | 20 | — |
| Ex 4-2 | AlN/SiAlON | 722.5 | 2.11 | <0.001 | 222 | 21.2 | 1.5 | 0.5 | 10 | 20 | — |

TABLE 4-continued

|  | Film mat'l | Thick. (nm) | n (at 550 nm) | k (at 400 nm) | E (GPa) | H (GPa) | P (mTorr) | O$_2$ flow (sccm) | SiAlON timing (s) | AlN timing (s) | SiAlN timing (s) |
|---|---|---|---|---|---|---|---|---|---|---|---|
| Ex 4-3 | AlN/SiAlON | 734.2 | 2.073 | <0.001 | 201 | 20.4 | 1.5 | 0.5 | 20 | 20 | — |
| Ex 4-4 | AlN/SiAlON | 674.4 | 2.077 | <0.001 | 195 | 21.1 | 1.5 | 0.5 | 10 | 30 | — |
| Ex 4-5 | AlN/SiAlON | 830.2 | 2.078 | <0.001 | 201 | 20.8 | 1.5 | 0.5 | 20 | 30 | — |
| Ex 4-6 | AlN/SiAlON | 509.4 | 2.052 | <0.001 | 195 | 20.1 | 1.5 | 0.5 | 5 | 20 | — |
| Ex 4-7 | AlN/SiAlON | 495.7 | 2.065 | <0.001 | 190 | 20.1 | 1.5 | 0.5 | 10 | 10 | — |
| Ex 4-8 | AlN/SiAlON | 652.5 | 2.074 | <0.001 | 192 | 18.9 | 1.5 | 0.5 | 20 | 10 | — |
| Ex 4-9 | AlN/SiAlON | 599 | 2.09 | <0.001 | 217 | 22 | 1.5 | 0.25 | 10 | 20 | — |
| Ex 4-10 | AlN/SiAlON | 751 | 2.08 | <0.001 | 225 | 23 | 1.5 | 0.25 | 20 | 20 | — |
| Ex 4-11 | SiAlON/AlN/SiAlN | 592.1 | 2.113 | <0.001 | 225 | 23 | 1.5 | 0.25 | 10 | 20 | 10 |
| Ex 4-12 | AlN/SiAlON | 191.8 | 2.104 | <0.001 | 186 | 20.2 | 1.5 | 0.5 | 10 | 20 | — |
| Ex 4-13 | AlN/SiAlON | 988.4 | 2.095 | <0.001 | 235 | 24 | 1.5 | 0.5 | 10 | 20 | — |
| Ex 4-14 | AlN/SiAlON | 1930.5 | 2.104 | <0.001 | 261 | 26 | 1.5 | 0.5 | 10 | 20 | — |
| Ex 4-15 | AlN/SiAlON | 1364.2 | 2.117 | <0.001 | 257 | 26.5 | 1.5 | 0 | — | 20 | 10 |

As is evident in Table 4 above, Examples 4-1 through 4-10 ("Ex. 4-1" through "Ex. 4-10") are indicative of AlN/SiAlON superlattices with 600 individual layers (i.e., 300 bi-layer stacks). These superlattice stacks exhibit hardness values higher than 19 GPa, even at film thicknesses below one micron. The hardness values for the AlN/SiAlON stacks in Table 4 are generally higher than those for the comparative, individual single layers in Tables 1 and 3, despite having total stack thicknesses that are generally lower than the thicknesses of the individual layers of these same samples in Table 1 and 3.

As is also evident from Table 4, Ex. 4-1 demonstrates the unexpected result that a 583 nm thick superlattice of AlN and SiAlON has a hardness of 21.8 GPa, while the individual materials shown in Table 1, Ex. 1-2 (i.e., AlN having a hardness 16.3 GPa and thickness of 568 nm) and Table 3, Ex. 3-2 (i.e., SiAlON having a hardness 20 GPa and thickness of 1222 nm). As such, Ex. 4-1 is indicative of a stack having a film structure characterized by a superhardening effect.

As is also evident from Table 4, each of the stacks designated by Exs. 4-1 through 4-7, Ex. 4-9 and Ex. 4-10 is indicative of a stack with superlattice films that can be characterized by a superhardening effect. Notably, the stack designated Ex. 4-10 exhibits a hardness of 23 GPa at a thickness of only 751 nm, the highest hardness measured for the coupling of AlN and SiAlON materials.

In addition, Ex. 4-12 in Table 4 shows that even at a total stack thickness of only 191.8 nm, such a stack (AlN/SiAlON) can exhibit a hardness of 20.2 GPa. As is also evident from Table 4, Exs. 4-13 and 4-14 use the same film layer pulses as Ex. 4-12, but use a greater number of pulses to make thicker films. Ex. 4-13 demonstrates a hardness of 24 GPa at a total stack thickness of only 988.4 nm. Ex. 4-14 demonstrates a hardness of 26 GPa at a total stack thickness of 1930.5 nm. Still further, Ex. 4-15 of Table 4 demonstrates that a layered structure of AlN and SiAlN having a total thickness of 1364.2 nm can exhibit a hardness of 26.5 GPa.

With regard again to Examples 1-4 and Tables 1-4, all of the materials prepared according to these examples were optically transparent and water clear by eye. Further, all of the materials in examples 1 through 4 were measured to have a very low absorption, with an associated extinction coefficient (k) of less than $10^{-3}$ at a wavelength of 400 nm.

It will be apparent to those skilled in the art that various modifications and variations can be made without departing from the spirit or scope of the invention.

What is claimed is:

1. An optical structure for a substrate, comprising:
   a stack of N bi-layers, N being set at a value of two or more and the stack having a thickness of at least 5 nm,
   wherein each bi-layer is defined by (a) a first layer; and (b) a second layer disposed on the first layer, the layers having at least one of different compositions and different microstructures,
   wherein the stack has a stack refractive index between about 1.2 and about 2.2 and a stack hardness of 15 GPa or greater when measured with a Berkovich Indenter Hardness Test along an indentation depth in the range from about 10% to about 50% of the thickness of the stack, when the stack is disposed on a glass test substrate having a hardness between 6.5 and 8 GPa,
   wherein each bi-layer has a thickness of approximately 3 nm or less, and
   further wherein N is from 20 to 2000.

2. The structure according to claim 1, wherein the first layer has an aluminum nitride composition and the second layer has a composition selected from the group consisting of aluminum oxynitride, silicon aluminum oxynitride and silicon aluminum nitride.

3. The structure according to claim 1, wherein the first layer comprises a material selected from the group consisting of oxides, nitrides and fluorides of alkaline earth and transition metals, boron, tin, and combinations thereof.

4. The structure according to claim 1, wherein the first layer comprises a material selected from the group consisting of silicon aluminum oxynitride, silicon oxynitride, aluminum oxynitride, silicon nitride, aluminum nitride, boron nitride, tin oxide, zirconium oxide, titanium oxide, silicon oxide, calcium oxide, aluminum oxide, boron oxide, magnesium oxide, barium fluoride, and calcium fluoride.

5. A device comprising:
a housing having front, back, and side surfaces;
electrical components that are at least partially inside the housing;
a display at or adjacent to the front surface of the housing; and
a cover substrate disposed over the display, wherein the cover substrate comprises the optical structure of claim 1.

6. An optical structure for a substrate, comprising:
a stack of N bi-layers, N being set at a value of two or more and the stack having a thickness of at least 5 nm,
wherein each bi-layer is defined by (a) a first layer; and (b) a second layer disposed on the first layer, the layers having at least one of different compositions and different microstructures,
wherein the stack has a stack refractive index between about 100% and about 150% of a refractive index of the substrate, and a stack hardness of 15 GPa or greater when measured with a Berkovich Indenter Hardness Test along an indentation depth in the range from about 10% to about 50% of the thickness of the stack, when the stack is disposed on a glass test substrate having a hardness between 6.5 and 8 GPa,
wherein each bi-layer has a thickness of approximately 3 nm or less, and
further wherein N is from 20 to 2000.

7. The structure according to claim 6, wherein the first layer has an aluminum nitride composition and the second layer has a composition selected from the group consisting of aluminum oxynitride, silicon aluminum oxynitride and silicon aluminum nitride.

8. The structure according to claim 6, wherein the first layer comprises a material selected from the group consisting of oxides, nitrides and fluorides of alkaline earth and transition metals, boron, tin, and combinations thereof.

9. The structure according to claim 6, wherein the first layer comprises a material selected from the group consisting of silicon aluminum oxynitride, silicon oxynitride, aluminum oxynitride, silicon nitride, aluminum nitride, boron nitride, tin oxide, zirconium oxide, titanium oxide, silicon oxide, calcium oxide, aluminum oxide, boron oxide, magnesium oxide, barium fluoride, and calcium fluoride.

10. A device comprising:
a housing having front, back, and side surfaces;
electrical components that are at least partially inside the housing;
a display at or adjacent to the front surface of the housing; and
a cover substrate disposed over the display, wherein the cover substrate comprises the optical structure claim 6.

11. A method of making an optically transparent article, comprising the steps:
forming a stack of N bi-layers on a substantially transparent substrate, N being set at a value of two or more and the stack having a thickness of at least 5 nm, wherein the step of forming the stack of N bi-layers further comprises:
(a) depositing a first layer; and
(b) depositing a second layer on the first layer,
wherein the steps of depositing the first and second layers are repeated N times, and the first and second layers have at least one of different compositions and different microstructures,
wherein the stack has a stack refractive index between 100% and about 150% of a refractive index of the substrate, and the article has an article hardness of 15 GPa or greater, the article hardness measured on the stack with a Berkovich Indenter Hardness Test along an indentation depth ranging from about 10% to about 50% of the thickness of the stack,
wherein each bi-layer has a thickness of approximately 3 nm or less, and
further wherein N is from 20 to 2000.

12. The method according to claim 11, wherein the forming step is conducted with a reactive sputtering process.

13. The method according to claim 11, wherein the first layer has an aluminum nitride composition and the second layer has an aluminum oxynitride composition.

14. The method according to claim 11, wherein the steps of depositing the first and second layers are conducted by alternating no oxygen gas flow and oxygen gas flow in a chamber containing the substrate, respectively.

15. The method according to claim 11, wherein N is set to at least 100, the thickness of the stack is 500 nm or greater, the article hardness is at least 17 GPa and the refractive index of the stack is less than 2.1.

16. The method according to claim 11, wherein N is set to at least 100, the thickness of the stack is 500 nm or greater, the article hardness is at least 20 GPa and the refractive index of the stack is less than 2.1.

17. The method according to claim 11, wherein the forming step is conducted with a metal mode sputtering process.

* * * * *